(12) United States Patent
Kim

(10) Patent No.: US 11,532,364 B2
(45) Date of Patent: Dec. 20, 2022

(54) CONTROLLER AND OPERATION METHOD THEREOF

(71) Applicant: SK hynix Inc., Gyeonggi-do (KR)

(72) Inventor: Dae Sung Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 53 days.

(21) Appl. No.: 17/240,286

(22) Filed: Apr. 26, 2021

(65) Prior Publication Data
US 2022/0165338 A1 May 26, 2022

(30) Foreign Application Priority Data
Nov. 25, 2020 (KR) .................. 10-2020-0159916

(51) Int. Cl.
| | |
|---|---|
| G11C 16/26 | (2006.01) |
| G11C 16/04 | (2006.01) |
| G11C 16/34 | (2006.01) |
| G06F 3/06 | (2006.01) |
| G06F 11/10 | (2006.01) |
| H03M 13/11 | (2006.01) |

(52) U.S. Cl.
CPC ............ *G11C 16/26* (2013.01); *G06F 3/0604* (2013.01); *G06F 3/0659* (2013.01); *G06F 3/0673* (2013.01); *G06F 11/1076* (2013.01); *G11C 16/0483* (2013.01); *G11C 16/349* (2013.01); *H03M 13/1105* (2013.01)

(58) Field of Classification Search
CPC . G11C 16/26; G11C 16/0483; G11C 11/5642; G11C 11/5671; G11C 29/021; G11C 29/028; G11C 16/08; G11C 16/3404; G11C 29/42; G06F 3/0604; G06F 3/0659; G06F 3/0673; G06F 11/1076; G06F 11/1072; G06F 11/1012; G06F 3/0658; G06F 3/0679; H03M 13/1105
USPC ........................................ 365/185.09, 189.09
See application file for complete search history.

(56) References Cited

U.S. PATENT DOCUMENTS

| | | | | |
|---|---|---|---|---|
| 2001/0033287 | A1* | 10/2001 | Naegle ................... | G09G 5/397 345/546 |
| 2002/0015041 | A1* | 2/2002 | Naegle ..................... | G06T 1/00 345/501 |
| 2002/0033828 | A1* | 3/2002 | Deering ................. | H04L 45/00 345/502 |
| 2002/0070944 | A1* | 6/2002 | Deering ................ | G06T 3/0081 345/581 |
| 2002/0158856 | A1* | 10/2002 | Deering ................ | G06F 3/1431 345/204 |

(Continued)

FOREIGN PATENT DOCUMENTS

KR  10-2019-0079327  7/2019

*Primary Examiner* — Michael T Tran
(74) *Attorney, Agent, or Firm* — IP & T Group LLP

(57) ABSTRACT

A controller for controlling a memory device including memory cells, the controller includes: a memory suitable for storing offset level information which is determined based on a sample read level according to characteristics of the memory cells and Gaussian modeling of the memory cells; and a processor suitable for generating an estimated read level based on the Gaussian madding and data read from the memory cells, and applying a compensated read voltage to control the memory device to perform read operations of the memory cells, wherein the compensated read voltage is generated by applying the offset level information to the estimated read level.

20 Claims, 14 Drawing Sheets

(56) References Cited

U.S. PATENT DOCUMENTS

| | | | |
|---|---|---|---|
| 2003/0122815 A1* | 7/2003 | Deering | G06T 5/20 |
| | | | 345/419 |
| 2003/0206179 A1* | 11/2003 | Deering | H04N 9/3185 |
| | | | 345/589 |
| 2010/0296350 A1* | 11/2010 | Kim | G11C 11/5642 |
| | | | 365/189.15 |
| 2015/0127883 A1* | 5/2015 | Chen | G06F 3/0679 |
| | | | 711/103 |
| 2018/0330264 A1* | 11/2018 | Lanting | G06F 15/163 |
| 2021/0182071 A1* | 6/2021 | Khammassi | G06N 10/40 |

* cited by examiner

<IDEAL>

<IDEAL>

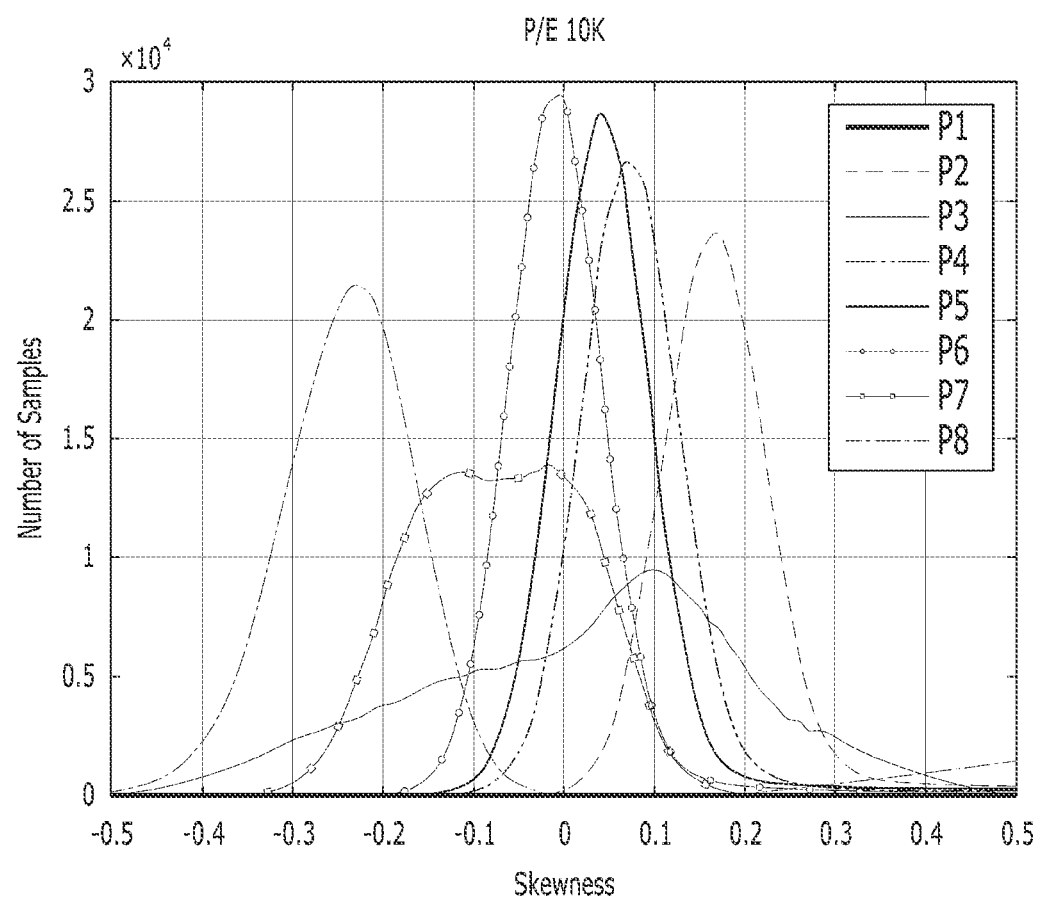

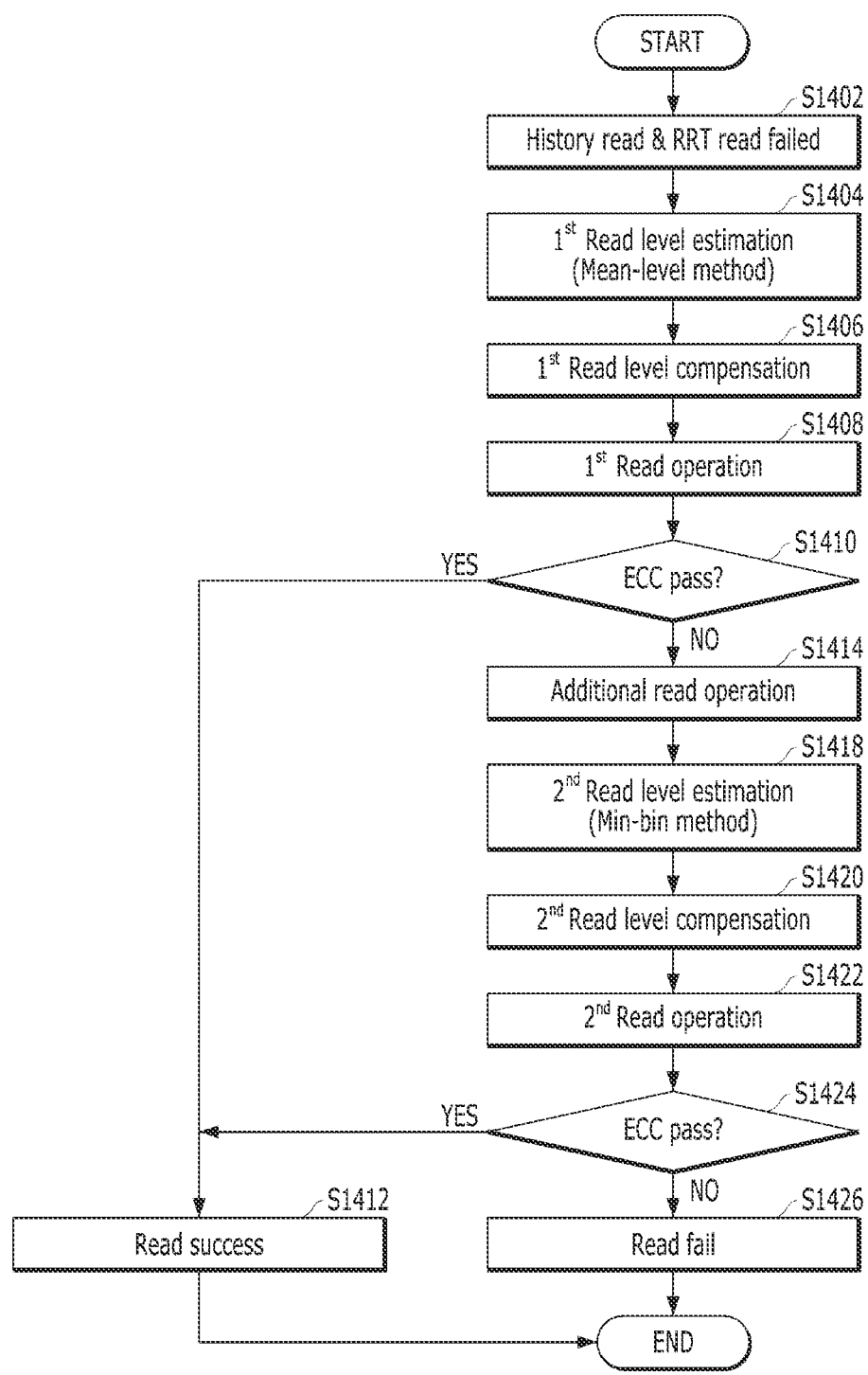

CONTROLLER AND OPERATION METHOD THEREOF

CROSS-REFERENCE TO RELATED APPLICATION

This application claims priority under 35 U.S.C. § 119 to Korean Patent Application No. 10-2020-0159916 filed on Nov. 25, 2020, which is incorporated herein by reference in its entirety.

BACKGROUND

1. Field

Embodiments relate to a controller for controlling a memory device, and an operation method thereof.

2. Discussion of the Related Art

In general, semiconductor memory devices are classified into is volatile memory devices, such as dynamic random access memory (DRAM) and static RAM (SRAM), and non-volatile memory devices, such as read only memory (ROM), mask ROM (MROM), programmable ROM (PROM), erasable PROM (EPROM), electrically EPROM (EEPROM), ferromagnetic RAM (FRAM), phase change RAM (PRAM), magnetic RAM (MRAM), resistive RAM (RRAM) and flash memory.

Volatile memory devices lose theft stored data when their power supplies are interrupted, whereas non-volatile memory devices retain theft stored data even when their power supplies are interrupted. Non-volatile flash memory devices are widely used as storage mediums in computer systems because of theft high program speed, low power consumption and large data storage capacity.

In non-volatile memory devices, especially in flash memory devices, the data state of each memory cell depends on the number of bits that the memory cell can program. A memory cell storing 1-bit data per cell is called a single-bit cell or a single-level cell (SLC). A memory cell storing multi-bit data (i.e., 2 or more bits data) per cell is called a mufti-bit cell, a mufti-level cell (MLC) or a mufti-state cell. An MLC is advantageous for high integration, However, as the number of bits programmed in each memory cell increases, the reliability decreases and the read failure rate increases.

For example, when k bits are programmed in a memory cell, one of $2^k$ threshold voltages is formed in the memory cell. Due to minute differences between the electrical characteristics of memory cells, the threshold voltages of memory cells programmed for the same data form threshold voltage distributions. Threshold voltage distributions correspond to $2^k$ data values corresponding to k-hit information, respectively.

However, a voltage window available for threshold voltage distributions is finite. Therefore, as the value k increases, the distance between the threshold voltage distributions decreases and the neighbouring threshold voltage distributions may overlap. As the neighbouring threshold voltage distributions overlap, read data may include error bits.

FIG. 1 schematically illustrates a threshold voltage distribution of program and erase states of a triple level cell (TLC) non-volatile memory device.

FIG. 2 schematically illustrates a threshold voltage distribution of program and erase states due to characteristic deterioration of the 3-bit MLC non-volatile memory device.

In an MLC non-volatile memory device, e.g., an TLC flash memory device capable of storing k-bit data in a single memory cell, the memory cell may have one of $2^k$ threshold voltage distributions. For example, the 3-bit MLC has one of 8 threshold voltage distributions.

Threshold voltages of memory cells programmed for the same data form a threshold voltage distribution due to characteristic differences between memory cells. In the TLC non-volatile memory device, as illustrated in FIG. 1, 8 threshold voltage distributions P1 to P8 are formed. For example, a first threshold voltage distribution P1 may indicate an erase state. FIG. 1 shows an ideal case in which threshold voltage distributions do not overlap and have sufficient read voltage margins therebetween, Referring to the flash memory example of FIG. 2, the memory cell may experience charge loss in which electrons trapped at a floating gate or tunnel oxide film are discharged over time. Such charge loss may accelerate when the tunnel oxide film deteriorates by iterative program and erase operations. Charge loss results in a decrease in the threshold voltages of memory cells. In the illustrated example of FIG. 2, the threshold voltage distribution may be shifted left due to charge loss.

Further, program disturbance, erase disturbance and/or back pattern dependency may cause increases in threshold voltages. As characteristics of memory cells deteriorate, neighbouring threshold voltage distributions may overlap, as illustrated in FIG. 2.

What is therefore required is a method for precisely reading data stored in memory cells of a semiconductor memory device,

SUMMARY

Various embodiments of the present disclosure are directed to a controller which can determine a read level for a read operation of a memory cell by reflecting skewness information of a memory cell distribution, thereby reducing the probability that a read error will occur, and an operation method thereof.

Also, various embodiments of the present disclosure are directed to a controller which can accurately and rapidly read data stored in a memory cell, and an operation method thereof.

In accordance with an embodiment of the present disclosure, a controller for controlling a memory device including memory cells, the controller includes: a memory suitable for storing offset level information which is determined based on a sample read level according to characteristics of the memory cells and Gaussian modeling of the memory cells; and a processor suitable for generating an estimated read level based on the Gaussian modeling and data read from the memory cells, and applying a compensated read voltage to control the memory device to perform read operations of the memory cells, wherein the compensated read voltage is generated by applying the offset level information to the estimated read level.

The sample read level may be a read level at which a number of error bits in read data is minimized in a sample memory device having the same characteristics of memory cells, among a plurality of read levels which the memory device is able to apply to the memory cells.

The processor may generate the estimated read level through an average level method, which includes calculating the section cell numbers corresponding to threshold voltage sections, based on the read data, determining average threshold voltage levels of respective threshold voltage distributions based on the section cell numbers and a set standard deviation, and determining a median value between adjacent average threshold voltage levels as the estimated read level.

The processor may update the estimated read level through a min-bin method, which includes determining a function of the number of memory cells depending on a threshold voltage level in the threshold voltage section having the smallest section cell number among the new section cell numbers corresponding to threshold voltage sections divided by additional read levels having set intervals from the read level of the compensated read voltage, based on the average threshold voltage level and the standard deviation, and determining, as a new estimated read level, a threshold voltage level corresponding to the minimum value of the determined function.

The offset level information may include an offset level associated with the average level method and an offset level associated with the min-bin method.

The processor may generate the estimated read level by determining a function of the number of memory cells depending on a threshold voltage level in the threshold voltage section having the smallest number of section cells among the section cell numbers corresponding to threshold voltage sections divided by additional read levels having set intervals from a hard read voltage, based on the average threshold voltage level and a set standard deviation, and determining, as the estimated read level, a threshold voltage level corresponding to the minimum value of the determined function.

The offset level information may include a lookup table indicating the relationship between the values of meta data associated with the memory cells and an offset level corresponding to the read voltage.

The meta data may include program/erase (P/E) cycles of the memory cells or retention states of data programmed in the memory cells.

The offset level information may include offset levels for one or more read voltages among a plurality of read voltages for reading the memory cells, wherein one or more offset levels for each of the read voltages exceed a set magnitude.

The processor may obtain the data read from the memory cells by controlling the memory device to perform a read operation on the memory cells by using a history read level or a read level included in a read retry table (RRT), and generate the estimated read level when a fail in error correction decoding on the read data is detected.

The controller may further include an error correction code (ECC) decoder suitable for performing error correction decoding on data read from the memory cells using the compensated read level.

In accordance with an embodiment of the present disclosure, a controller for controlling a memory device including memory cells, the controller includes: a memory suitable for storing parameter offset information which is determined based on a sample parameter value according to characteristics of the memory cells and Gaussian modeling of the memory cells; and a processor suitable for generating an estimated parameter value based on data read from the memory cells and the Gaussian modeling, generating a compensated parameter value by applying parameter offset information to the estimated parameter value, and controlling the memory device to perform a read operation using a compensated read level which is generated by estimating a read level based on the compensated parameter value.

The parameter offset information may be determined in advance based on the sample parameter value and a sample estimation parameter value which are experimentally determined according to memory cell characteristics of the memory device.

The processor may generate the compensated read level by using an average level method, which includes calculating the section cell numbers corresponding to threshold voltage sections, based on the read data, generating the estimated parameter value by determining estimated average threshold voltage levels of the respective threshold voltage distributions based on the section cell numbers and a standard deviation, generating a compensated average threshold voltage level by applying the parameter offset information to the estimated average threshold voltage levels, and determining, as the compensated read level, a median value between adjacent compensated average threshold voltage levels.

The memory may further store multiplier information of a parameter which is determined based on the sample parameter value and the Gaussian modeling of the memory cells, and wherein the processor further performs an operation of generating a compensated standard deviation by applying the multiplier information of the parameter to a set standard deviation, to determine the estimated average threshold voltage levels.

The processor may update the compensated read level through a min-bin method, which includes determining a function of the number of memory cells depending on a threshold voltage level in the threshold voltage section having the smallest number of section cells among the numbers of new section cells corresponding to threshold voltage sections divided by additional read levels having set intervals from the compensated read level, based on the compensated average threshold voltage level and the compensated standard deviation, and determining, as a new compensated read level, a threshold voltage level corresponding to the minimum value of the determined function.

The offset level information may include an offset level associated with the average level method and an offset level associated with the min-bin method.

The parameter level information may include a lookup table indicating the relationship between the values of meta data associated with the memory cells and parameter offsets corresponding to the read voltage.

The meta data may include program/erase (P/E) cycles of the memory cells or retention states of data programmed in the memory cells.

In accordance with an embodiment of the present disclosure, a memory system includes: a memory device including a plurality of memory cells; and a controller coupled to the memory device and including a processor configured to: generate an estimated read level based on data, which is read from the memory cells, using Gaussian modeling; generate a compensated read level based on the estimated read level and an offset level, which is determined based on a difference between an optimal read level according to characteristics of the memory cells and a read level according to the Gaussian modeling; and control the memory device to perform a read operation on the memory cells using the compensated read level.

In accordance with the present embodiments of the present disclosure, it is possible to provide a controller which can determine a read level for a read operation of a memory cell by reflecting skewness information of a memory cell distribution, thereby reducing the probability that a read error will occur, and an operation method thereof.

Furthermore, it is possible to provide a controller which can accurately and rapidly read data stored in a memory cell, and an operation method thereof.

The effects which can be obtained by the present disclosure are not limited to those mentioned above, and the other effects which are not mentioned can be clearly understood by the person skilled in the art from the following descriptions.

BRIEF DESCRIPTION OF THE DRAWINGS

FIGS. 9A and 9B are graphs illustrating the skewness of threshold voltage distributions depending on memory cell characteristics and program/erase (P/E) cycles.

FIGS. 13 and 14 are flowcharts illustrating an operation in accordance with the first embodiment of the present invention.

DETAILED DESCRIPTION

Hereafter, various embodiments of the present disclosure will be described with reference to the accompanying drawings. The present disclosure may, however, be embodied in different forms and should not be construed as limited to the embodiments set forth herein. Rather, these embodiments are provided in order to bring this disclosure to perfection, and to fully convey the scope of the present invention to those skilled in the art.

Figure 3:
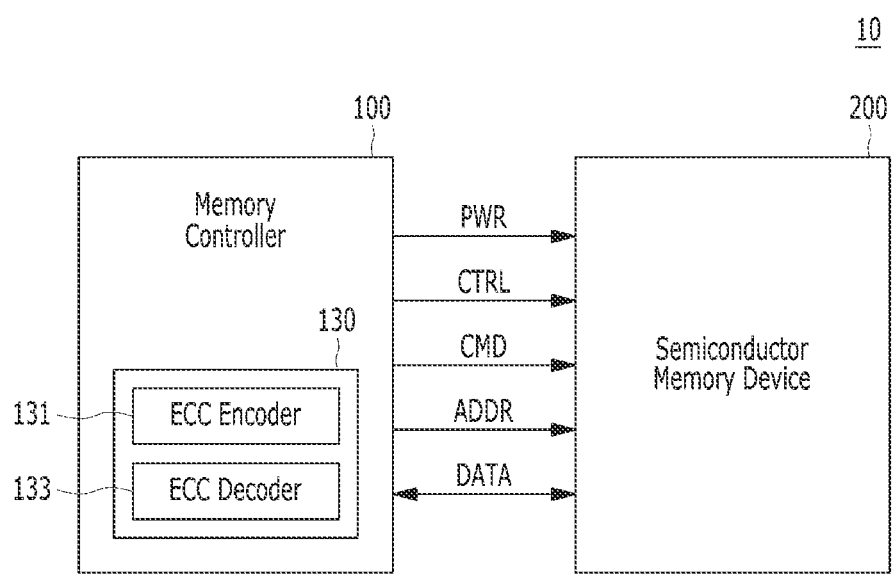
FIG. 3 is a block diagram illustrating a semiconductor memory system in accordance with an embodiment of the present invention.

FIG. 3 is a block diagram schematically illustrating a semiconductor memory system 10, in accordance with an embodiment of the present invention.

Figure 4A:
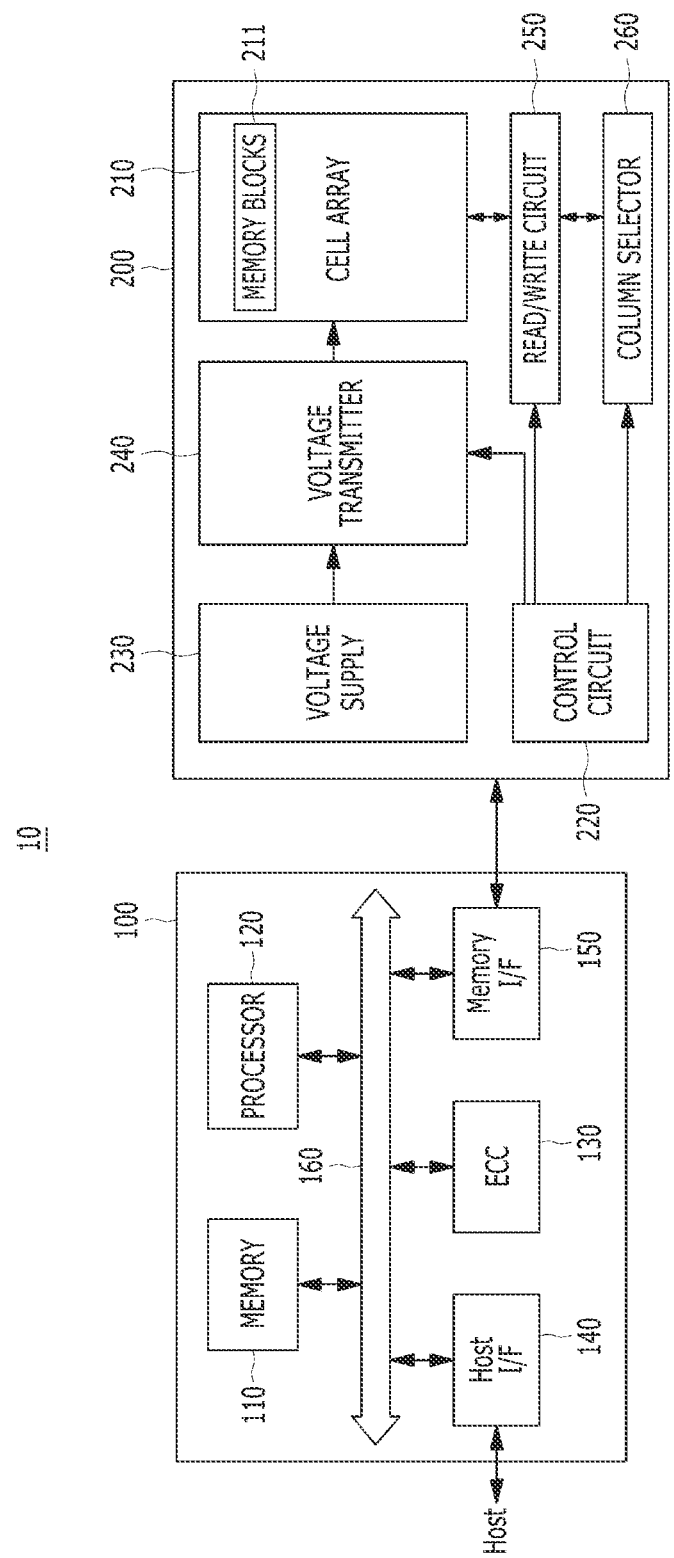
FIG. 4A is a detailed block diagram illustrating the semiconductor memory system illustrated in FIG. 3.
Figure 4B:
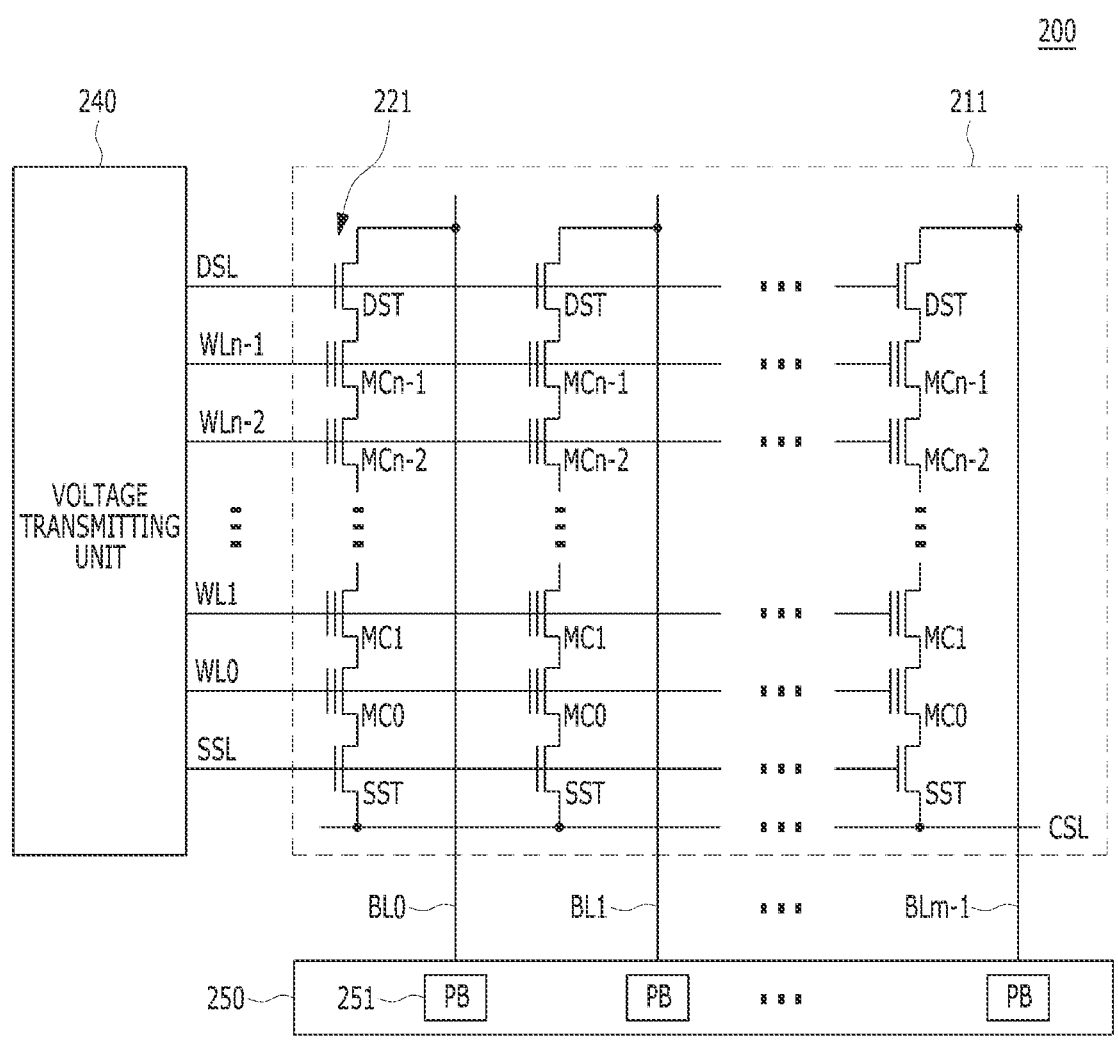
FIG. 4B is a block diagram illustrating a memory block illustrated in FIG. 4A.

FIG. 4A is a block diagram illustrating in more detail the semiconductor memory system 10 of FIG. 3, and FIG. 4B is a circuit diagram illustrating a configuration of a memory block 211 employed in the semiconductor memory system of FIG. 4A.

Referring now to FIGS. 3 to 4B, the semiconductor memory system 10 is provided, according to an embodiment of the present invention. The semiconductor memory system 10 may include a semiconductor memory device 200 operatively coupled to a memory controller 100.

The semiconductor memory device 200 may perform one or more of an erase, a program, and a read operation under the control of the memory controller 100. The semiconductor memory device 200 may receive a command CMD, an address ADDR and data DATA through a plurality of input/output lines from the memory controller 100. The semiconductor memory device 200 may receive power PWR through a power line and a control signal CTRL through a control line from the memory controller 100. The control signal may include a command latch enable (CLE) signal, an address latch enable (ALE) signal, a chip enable (CE) signal, a write enable (WE) signal, a read enable (RE) signal, and so on.

The memory controller 100 may control the overall operations of the semiconductor memory device 200. The memory controller 100 may include an error correction code (ECC) (e.g., a low density parity check (LDPC) code) component 130 for correcting error bits, The LDPC component 130 may include an ECC encoder (e.g., an LDPC encoder) 131 and an ECC decoder (e.g., an LDPC decoder) 133.

The LDPC encoder 131 may perform error correction encoding on data to be programmed into the semiconductor memory device 200 to output data to which parity bits are added. The encoded data with the parity bits may be stored in the semiconductor memory device 200.

The LDPC decoder 133 may perform error correction decoding on data read from the semiconductor memory device 200. The LDPC decoder 133 may determine whether the error correction decoding is successful, and may output an instruction signal based on the determination result. The LDPC decoder 133 may correct error bits of data using the parity bits generated by the LDPC encoding operation.

When the number of error bits exceeds the error correction capacity of the LDPC component 130, the LDPC component 130 may not correct the error bits. In this case, the LDPC component 130 may generate an error correction fail signal.

The memory controller 100 and the semiconductor memory device 200 may be integrated in a single semiconductor device. For example, the memory controller 100 and the semiconductor memory device 200 may be integrated in a single semiconductor device such as a solid-state drive (SSD). The solid state drive may include a storage device for storing data in a semiconductor memory. When the semiconductor memory system 10 is used in an SSD, operation speed of a host (not shown) coupled to the semiconductor memory system 10 may be remarkably improved.

The memory controller 100 and the semiconductor memory device 200 may be integrated in a single semiconductor device such as a memory card. For example, the memory controller 100 and the semiconductor memory device 200 may be integrated in a single semiconductor device to configure a memory card such as a PC card of personal computer memory card international association (PCMCIA), a compact flash (CF) card, a smart media (SM) card, a memory stick, a multimedia card (MMC), a reduced-size multimedia card (RS-MMC), a micro-size version of MMC (MMCmicro), a secure (digital (SD) card, a mini secure (digital (miniSD) card, a micro secure digital (microSD) card, a secure digital high capacity (SDHC), and a universal flash storage (UFS).

For another example, the semiconductor memory system 10 may be provided as one of various elements comprising an electronic device such as a computer, an ultra-mobile PC (UMPC), a workstation, a net-book computer, a personal digital assistants (PDA), a portable computer, a web tablet PC, a wireless phone, a mobile phone, a smart phone, an e-book reader, a portable multimedia player (PMP), a portable game device, a navigation device, a black box, a digital camera, a digital multimedia broadcasting (DMB) player, a 3-dimensional television, a smart television, a digital audio recorder, a digital audio player, a digital picture recorder, a digital picture player, a digital video recorder, a digital video player, a storage device of a data center, a device capable of receiving and transmitting information in a wireless environment, one of electronic devices of a home network, one of electronic devices of a computer network, one of electronic devices of a telematics network, an radio-frequency identification (RFID) device, or of a computing system.

Referring to FIG. 4A, in addition to the ECC component 130, the memory controller 100 may include a memory 110, a processor 120, a host interface (I/F) 140, a memory interface 150 and a system bus 160.

The host interface 140 may communicate with a host through one or more of various interface protocols such as a universal serial bus (USB), a multi-media card (MMC), a peripheral component interconnect express (PCI-e or PCIe), a small computer system interface (SCSI), a serial-attached SCSI (SAS), a serial advanced technology attachment (SATA), a parallel advanced technology attachment (DATA), an enhanced small disk interface (ESDI), and/or an integrated drive electronics (IDE), The memory interface 150 may serve as a memory/storage interface for interfacing the memory controller 100 and the semiconductor memory device 200 such that the memory controller 100 controls the semiconductor memory device 200 in response to a request from the host. When the semiconductor memory device 200 is a flash memory or specifically a NAND flash memory, the memory interface 150 may generate a control signal for the semiconductor memory device 200 and process data to be provided to the semiconductor memory device 200 under the control of the processor 120. The memory interface 150 may work as an interface (e.g., a NAND flash interface) for processing a command and data between the memory controller 100 and the semiconductor memory device 200. Specifically, the memory interface 150 may support data transfer between the memory controller 100 and the semiconductor memory device 200.

The processor 120 may control overall operation of the semiconductor memory system 10. The processor 120 may drive firmware to control overall operation of the semiconductor memory system 10. The firmware may be referred to as flash translation layer (FTL). The processor 120 may be realized as a microprocessor or a central processing unit (CPU).

The processor 120 may drive the FTL and perform a foreground operation corresponding to a request received from the host. For example, the processor 120 may control a write operation of the semiconductor memory device 200 in response to a write request from the host and control a read operation of the semiconductor memory device 200 in response to a read request from the host.

The memory 110 may serve as a working memory of the semiconductor memory device 200 and the memory controller 100, and store data for driving the semiconductor memory device 200 and the memory controller 100. The memory controller 100 may control the semiconductor memory device 200 to perform read, program and erase operations in response to a request from the host. The memory controller 100 may provide data read from the semiconductor memory device 200 to the host, and may store data provided from the host into the semiconductor memory device 200. The memory 110 may store data for the memory controller 100 and the semiconductor memory device 200 to perform various operations above.

The memory 110 may be embodied by a volatile memory. For example, the memory 110 may be embodied by static random access memory (SRAM) or dynamic random access memory (DRAM). The memory 110 may be disposed within or externally to the memory controller 100. In the illustrated example of FIG. 4A, the memory 110 is disposed within the memory controller 100. In another embodiment, the memory 110 may be embodied by an external volatile memory having a memory interface for transferring data between the memory 110 and the memory controller 100.

The ECC component 130 may detect and correct errors in the data read from the semiconductor memory device 200. The memory interface 150 may interface with the semiconductor memory device 200. The ECC encoder 131 and the ECC decoder 133 may be implemented as different and independent components even though FIGS. 3 and 4A shows the ECC component 130 including both the ECC encoder 131 and the ECC decoder 133. The processor 120 may perform various control operations.

In accordance with an embodiment of the present invention, during a program operation, the ECC component 130 may perform an LDPC encoding operation on original data which is to be programmed to the semiconductor memory device 200. During a read operation, the ECC component 130 may perform an LDPC decoding operation on the LDPC-encoded data or a codeword, which is stored in the semiconductor memory device 200.

The ECC component 130 may then restore the original data by performing an LDPC decoding operation on the LDPC-encoded data or to the codeword stored in the semiconductor memory device 200.

The semiconductor memory device 200 may include a memory cell array 210, a control circuit 220, a voltage supply 230, a voltage transmitter 240, a read/write circuit 250, and a column selector 260.

The memory cell array 210 may include a plurality of memory blocks 211. User data may he stored in the memory blocks 211. The user data may be encoded as described above.

Referring to FIG. 4B, a configuration of a representative memory block of the memory blocks 211 may include a plurality of cell strings 221 coupled to bit lines BL0 to BLm-1, respectively. The cell string 221 of each column may include one or more drain selection transistors DST and one or more source selection transistors SST. A plurality of memory cells or memory cell transistors may be serially coupled between the selection transistors DST and SST. Each of the memory cells MC0 to MCn-1 may be preferably formed as a multi-level cell (MLC) storing data information of multiple bits in each cell. The cell strings 221 may be electrically coupled to the corresponding bit lines BL0 to BLm-1, respectively, In the illustrated example, FIG. 4B illustrates a memory block 211 comprising a NAND-type flash memory cell. However, the semiconductor memory device 200 is not limited to being NAND flash memory. In another example, the semiconductor memory device 200 may comprise a NOR-type flash memory, a hybrid flash memory in which two or more types of memory cells are combined, and one-NAND flash memory in which a controller is embedded inside a memory chip. Operation characteristics of the semiconductor device may be applied to a charge trap flash (CTF) in which a charge storing layer is formed by an insulating layer, as well as the flash memory device in which a charge storing layer is formed by a conductive floating gate.

Referring back to FIG. 4A, the control circuit 220 may control an overall operation including specific operations related to program, erase, and read operations of the semiconductor memory device 200.

The voltage supply 230 may provide word line voltages, for example, a program voltage, a read voltage, and a pass voltage, to the respective word lines according to an operation mode. Further, the voltage supply 230 may provide a voltage to be supplied to a bulk, for example, a well region in which the memory cells are formed. A voltage generating operation of the voltage supply 230 may be performed under control of the control circuit 220.

The voltage supply 230 may generate a plurality of variable read voltages for generating a plurality of read data.

The voltage transmitter 240 may select one of the memory blocks 211 or sectors of the memory cell array 210, and may select one of the word lines of the selected memory block under the control of the control circuit 220. The voltage transmitter 240 may provide the word line voltage generated from the voltage supply 230 to selected word lines or non-selected word lines under the control of the control circuit 220.

The read/write circuit 250 may be controlled by the control circuit 220 and may operate as a sense amplifier or a write driver according to an operation mode. For example, during a verification/normal read operation, the read/write circuit 250 may operate as a sense amplifier for reading data from the memory cell array 210. During a normal read operation, the column selector 260 may output the data read from the read/write circuit 250 to another component, for example, to the memory controller 100, based on column address information. During a verification read operation, the read data may be provided to a pass/fail verification circuit (not illustrated) included in the semiconductor memory device 200, and may be used for determining whether a program operation of the memory cell succeeds.

During a program operation, the read/write circuit 250 may operate as a write driver for driving the bit lines according to data to be stored in the memory cell array 210. During a program operation, the read/write circuit 250 may receive data to be written in the memory cell array 210 from a buffer (not illustrated), and may drive the bit lines according to the input data. To this end, the read/write circuit 250 may include a plurality of page buffers (PB) 251 corresponding to the columns (or the bit lines) or column pairs (or bit line pairs), respectively. A plurality of latches may be included in each of the page buffers 251.

The read operation on the data stored in the semiconductor memory device 200 may include a hard read operation and a soft read operation.

The hard read operation is an operation of applying hard read voltages and reading data from the semiconductor memory device 200. The hard read voltage is a voltage for distinguishing between adjacent threshold voltage distributions. For example, a memory cell may be turned on when a read voltage having a higher read level than the threshold voltage thereof is applied, and turned off when a read voltage having a lower read level than the threshold voltage thereof is applied. Data may be read by sensing a current formed in a bit line while a memory cell is turned on or off. The ECC decoder 133 may perform hard decision decoding on data read by applying the hard read voltages, thereby correcting an error of the read data.

The soft read operation is an operation of reading data from the semiconductor memory device 200 with soft read voltages having a different level from the reference read level. For example, the soft read voltages may be applied to the memory cells which are read by applying the hard read voltages, in order to additionally perform the soft read operation. A reliability value may be added to the data, read by applying hard read voltages, by the data read by applying the soft read voltages. The ECC decoder 133 may perform soft decision decoding using the reliability value and the data read through the hard read voltages, thereby correcting an error of the read data.

Figure 5:
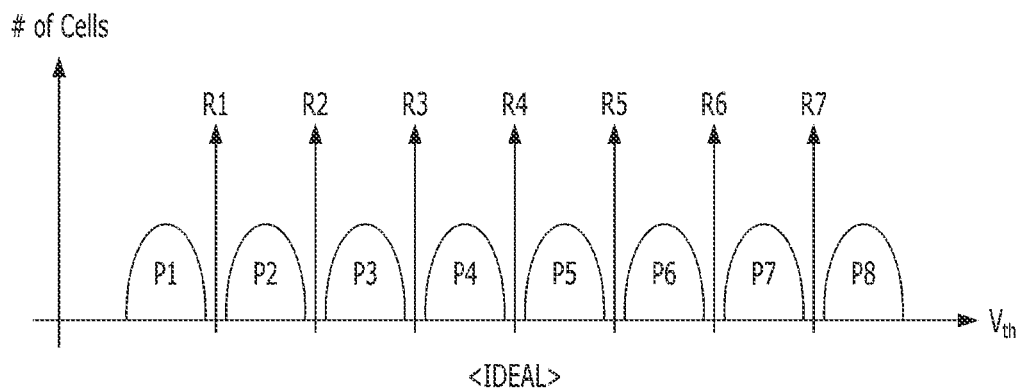
FIG. 5 is a graph illustrating a hard read voltage in the case that memory cells have the ideal threshold voltage distributions.

FIG. 5 is a graph illustrating hard read voltages in the case that memory cells have the ideal threshold voltage distributions.

Figure 1:
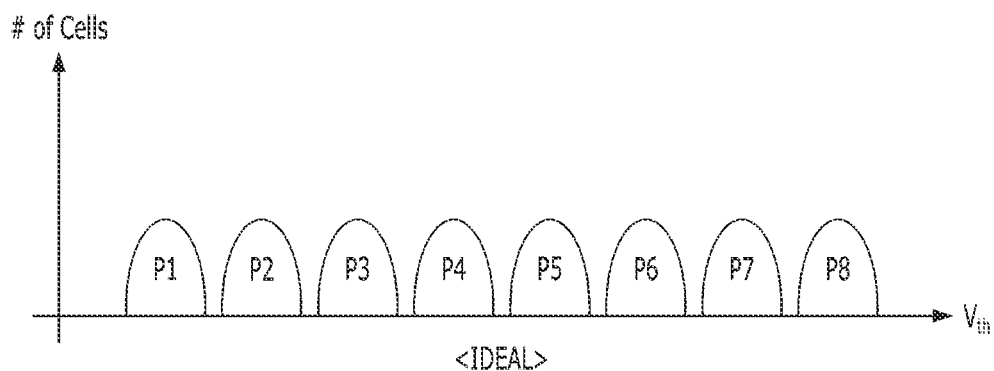
FIG. 1 schematically illustrates a threshold voltage distribution of logic states of a triple level cell (TLC) nonvolatile memory device.

By way of example, FIG. 5 illustrates that the memory cells form ideal threshold voltage distributions P1 to P8 as described with reference to FIG. 1, and each of first to seventh read voltages R1 to R7 has a default read level. Since the ideal threshold voltage distributions P1 to P8 do not overlap one another, the logic states thereof may be accurately distinguished from one another. Therefore, the semiconductor memory device 200 may accurately distinguish among the first to eighth threshold voltage distributions P1 to P8 by applying first to seventh read voltages R1 to R7 having the (default read levels, and read the data of the memory cells without an error.

Figure 2:
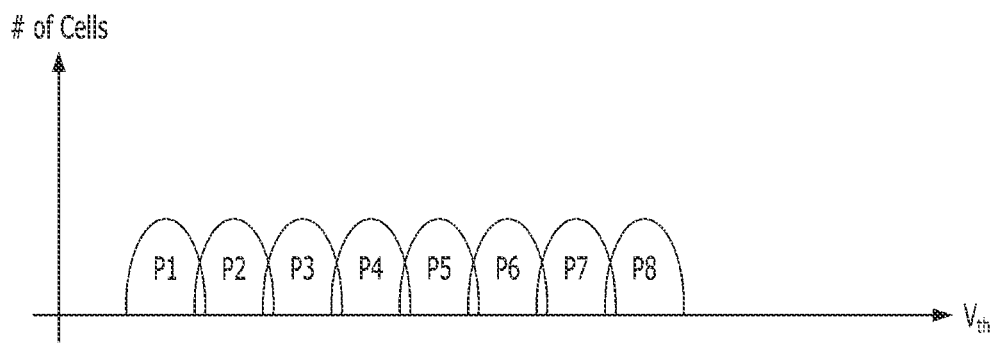
FIG. 2 schematically illustrates a threshold voltage distribution of logic states which may be shifted by degradation in characteristic of the TLC nonvolatile memory device.

However, the threshold voltage distributions may be shifted as described with reference to FIG. 2. In this case, the shifted threshold voltage distributions P1 to P8 may not be accurately distinguished through the default read levels. When the threshold voltage distributions P1 to P8 are not normally distinguished, error bits may occur in data read from the semiconductor memory device 200. The ECC decoder 133 may fail in error correction decoding on the read data, when the number of error bits in the read data is greater than or equal to a correctable error bit threshold.

As long as the processor 120 can use read levels corresponding to a point where adjacent threshold voltage distributions cross each other in order to control the read operation of the semiconductor memory device 200, it is possible to minimize the number of error bits in data read form the semiconductor memory device 200. The read level at which the number of error bits in read data is minimized, among a plurality of read levels which the semiconductor memory device 200 can apply, may be referred to as the optimal read level. As long as the processor 120 can use the optimal read level, it is possible to increase the probability that the errors of the data read from the semiconductor memory device 200 will be successfully corrected. However, when the threshold voltage distributions of the memory cells are shifted, it is difficult for the processor 120 to accurately find the point where adjacent threshold voltage distributions cross each other. The processor 120 may determine the read levels of the first to seventh read voltages R1 to R7 through various methods, in order to reduce the number of error bits in the data read from the semiconductor memory device 200. Hereafter, one set of the read levels of the first to seventh read voltages R1 to R7 may be referred to as a read level set.

As a first example of the method for determining a read level set, a history read level set may be used. The processor 120 may store the read levels of the first to seventh read voltages R1 to R7 as the history read level set in the memory 110. Here, the read levels may be used to read data on which error correction decoding has been successfully performed. The memory 110 may store the history read level set for each memory block. The processor 120 may use the history read level set of a certain memory block in order to read data from the memory block. Hereafter, the read operation performed by using the history read level set may be referred to as a history read operation.

As a second example of the method for determining a read level set, a read retry table (RRT) may be used. The RRT may store a plurality of read level sets therein in advance, and be loaded to the memory 110. The processor 120 may determine the read levels of the read voltages R1 to R7 based on the RRT including the plurality of read level sets therein. For example, the processor 120 may sequentially use several read level sets having high priorities in the RRT, until error correction decoding is successfully performed on the read data. Hereafter, the read operation which is performed by using the RRT may be referred to as an RRT read operation.

As a third example of the method for determining a read level set, estimated threshold voltage distributions may be used to determine an estimated read level set. The processor 120 may estimate threshold voltage distributions based on data read from the semiconductor memory device 200 through a reference read level set. The processor 120 may determine an estimated read level set based on the estimated threshold voltage distributions. The processor 120 may determine, as the reference read level set, the default read level set, the history read level set, a plurality of read level sets included in the RRT, or the soft read levels of the read level sets.

Hereafter, an example of the method for determining an estimated read level set will be described with reference to FIGS. 6 and 7.

Figure 6:
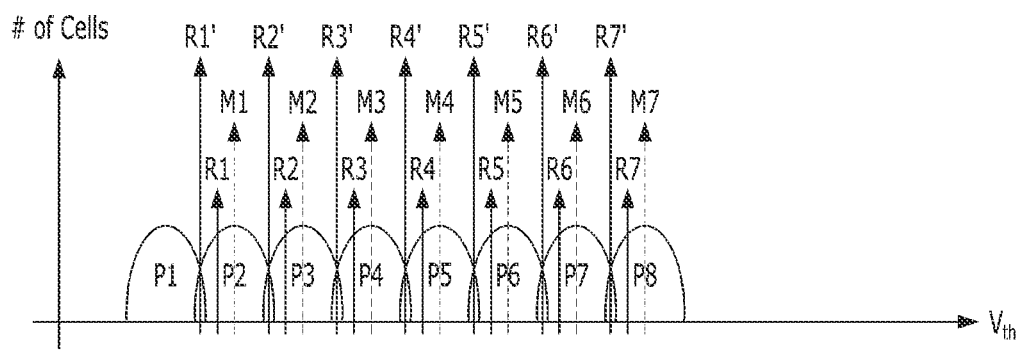
FIG. 6 is a diagram for describing an average level method as a first example of a method for determining an estimated read level set.

FIG. 6 illustrates read voltages R1 to R7 having the reference read levels and the shifted threshold voltage distributions described with reference to FIG. 2. In the example of FIG. 6, when the reference read level set is used, the threshold voltage distributions P1 to P8 based on the shifted threshold voltage distributions may not be accurately distinguished. For example, the seventh read voltage R7 may be a read voltage for distinguishing between seventh and eighth threshold voltage distributions P7 and P8. However, when the semiconductor memory device 200 applies the seventh read voltage R7 to the memory cells having the shifted threshold voltage distributions in the example of FIG. 6, some of the data programmed to have the eighth threshold voltage distribution P8 may be wrongly read as data having the seventh threshold voltage distribution P7. Therefore, the read data may include error bits which exceed the correctable error bit threshold. Thus, the processor 120 may determine the estimated read level set by estimating the threshold voltage distributions, and use the estimated read level set to control a read operation of the semiconductor memory device 200.

The threshold voltage distributions may be mathematically modeled. For example, the threshold voltage distributions may be modeled as Gaussian distributions. When the threshold voltage distributions are modeled as Gaussian distributions, the processor 120 may determine the estimated read level set based on the average and standard deviation of the threshold voltage distributions.

FIG. 6 illustrates an average level method as a first example of a method for determining an estimated read level set based on Gaussian modeling.

The processor 120 may estimate the average threshold voltage levels of threshold voltage distributions based on the reference read level set and the standard deviation, and determine the estimated read level set based on the estimated average threshold voltage levels.

For example, the processor 120 may calculate the section cell number corresponding to each of threshold voltage sections divided by the reference read level set, based on data read from the memory cells through the reference read level set. The processor 120 may estimate the voltage levels of average threshold voltages M1 to M7 of the threshold voltage distributions based on the calculated section cell numbers, the standard deviation and a Gaussian distribution function. The processor 120 may use a predetermined constant as the standard deviation. The processor 120 may determine an estimated read level set for reading data stored in the semiconductor memory device 200, based on the voltage levels of the average threshold voltages M1 to M7.

FIG. 6 illustrates read voltages R1' to R7' having estimated read levels. Referring to FIG. 6, the estimated read level set may be closer to the optimal read level set than the reference read level set. Therefore, data read by applying the read voltages R1' to R7' having the estimated read levels may include a smaller number of error bits than data read by applying the read voltages R1 to R7 having the reference read levels.

Figure 7:
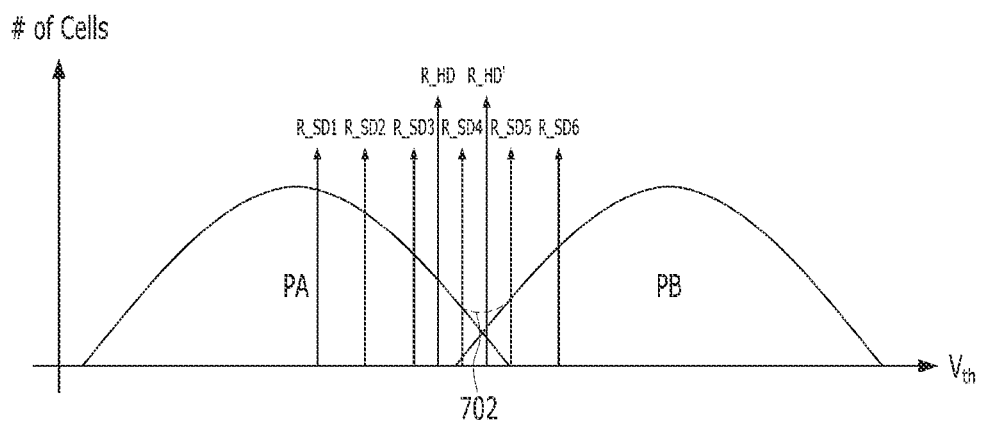
FIG. 7 is a diagram for describing a min-bin method as a second example of the method for determining an estimated read level.

FIG. 7 is a graph for describing a min-bin method as a second example of the method for determining an estimated read level through Gaussian modeling.

By way of example, FIG. 7 illustrates a hard read voltage R_HD between a threshold voltage distribution A (i.e., PA) and a threshold voltage distribution B (i.e., PB) and soft read voltages R_SD1 to R_SD6 around the hard read voltage R_HD.

The threshold voltage distribution A (PA) and the threshold voltage distribution B (PB) indicate two random adjacent threshold voltage distributions among the threshold voltage distributions described with reference to FIG. 5. The hard read voltage R_HD may be a read voltage for distinguishing between the two adjacent threshold voltage distributions among the first to seventh read voltages R1 to R7.

In the example of FIG. 7, each of the read levels of the soft read voltages R_SD1 to R_SD6 may be determined to have a predetermined interval from the read level of the hard read voltage R_HD.

The ECC decoder 133 may add a reliability value to the data read by applying the hard read voltage R_HD, based on data read by applying the soft read voltages R_SD1 to R_SD6. For example, the reliability value may be a log likelihood ratio (LLR). The ECC decoder 133 may detect and correct an error of encoded data read from the semiconductor memory device 200, i.e., a codeword, using the reliability value.

When the soft read voltages R_SD1 to R_SD6 whose read levels are determined according to the read level of the hard read voltage R_HD are applied in the case that the read level of the hard read voltage R_HD is not dose to the optimal read level, an inaccurate reliability value may be added.

When performing soft decision decoding using the read data and the inaccurate reliability value, the ECC decoder 133 may fail in error correction.

The processor 120 may determine the estimated read level based on the data read through the soft read voltages R_SD1 to R_SD6 having the reference read levels, in order to acquire a more accurate reliability value.

For example, the processor 120 may determine the read levels of the soft read voltages as the reference read levels. The processor 120 may calculate the section cell number corresponding to each of the threshold voltage sections divided by the reference read levels, based on the data read by applying the soft read voltages R_SD1 to R_SD6. Each of the threshold voltage sections may be referred to as a bin label section. A dotted line 702 in FIG. 7 indicates the total number of memory cells in a section where memory cells having the threshold voltage distribution A (PA) and memory cells having the threshold voltage distribution B (PB) overlap each other.

The processor 120 may determine, as the estimated read level, a read level included in the threshold voltage section including the smallest section cell number. For example, the processor 120 may determine a function of the total number of memory cells according to the threshold voltage levels, based on the average threshold voltage level and standard deviation of the threshold voltage distributions. The dotted line 702 in FIG. 7 indicates the total number of memory cells in a section where the memory cells having the threshold voltage distribution A (PA) and the memory cells having the threshold voltage distribution B (PB) overlap each other.

The processor 120 may determine, as the estimated read level, a threshold voltage level corresponding to the minimum value of the estimated function in the threshold voltage section. By way of example, FIG. 7 illustrates a hard read voltage R_HD' having the estimated read level.

When determining the estimated read levels for all of the adjacent threshold voltage distributions using the min-bin method, the processor 120 may determine the estimated read levels of all the read voltages R1 to R7.

Referring to FIG. 7, the estimated read level may be closer to the optimal read level than the reference read level. Therefore, data read by applying the read voltages having the estimated read levels may include a smaller number of error bits than data read by applying the read voltages having the reference read levels.

When using the average level method and the min-bin method in the case that the threshold voltage distributions correspond to Gaussian distributions, the processor 120 may determine the estimated read level dose to the optimal read level. However, the threshold voltages do not necessarily form Gaussian distributions. The threshold voltages may form an asymmetric& distribution due to various reasons.

Figure 8A:
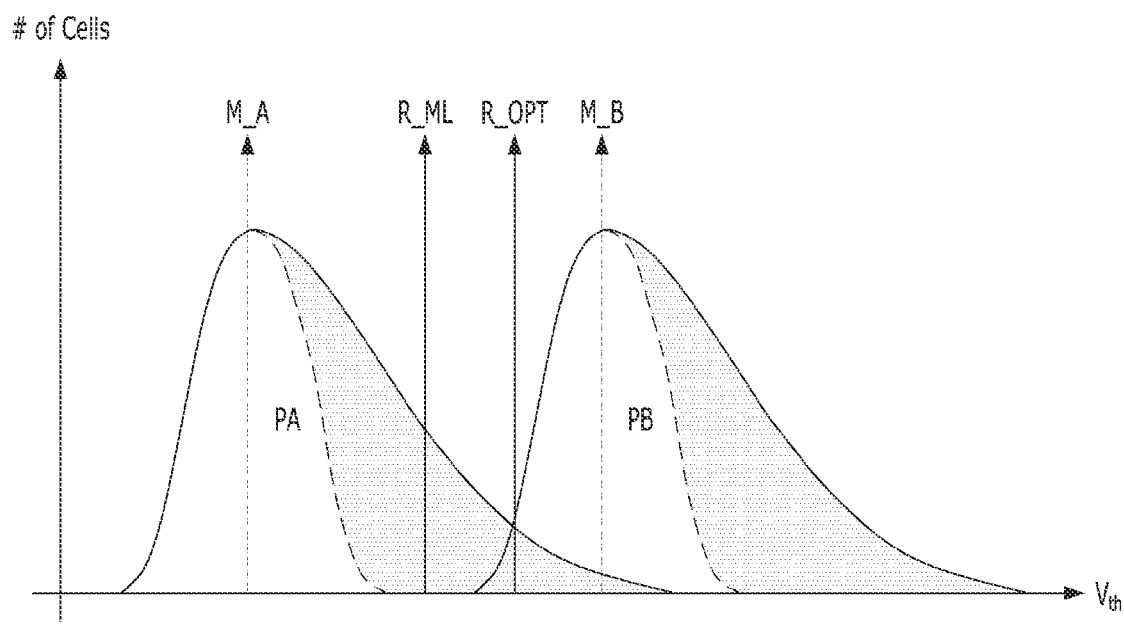
FIGS. 8A and BB are graphs illustrating the cases in which threshold voltage distributions are asymmetrical.
Figure 8B:
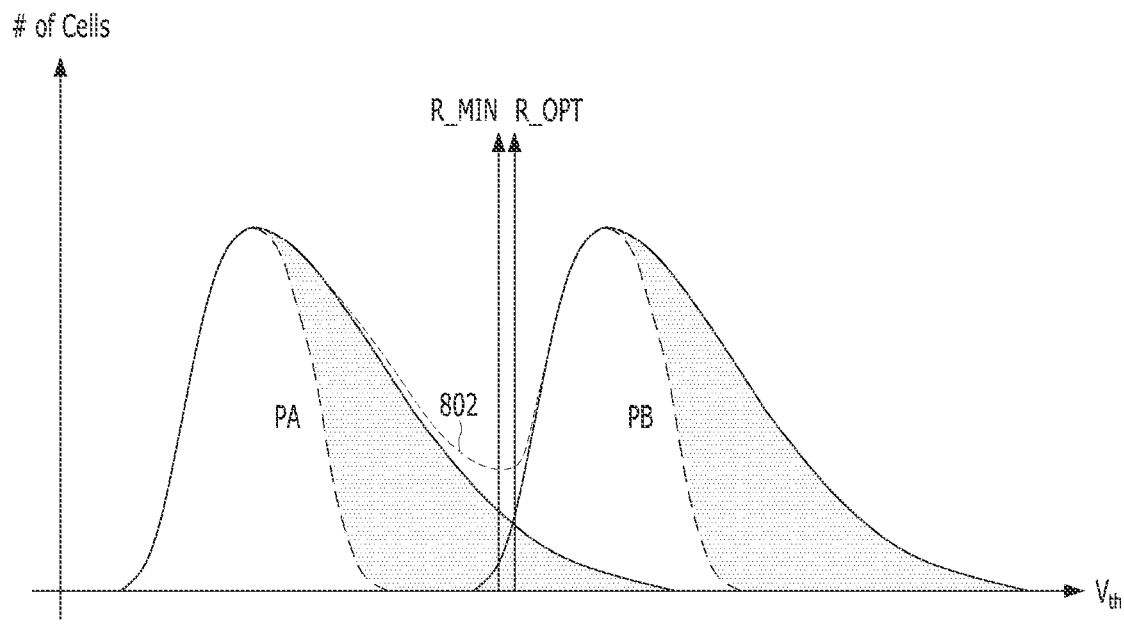

FIGS. 8A and 8B are graphs illustrating the cases in which threshold voltage distributions are asymmetrical. Specifically FIGS. 8A and 8B illustrate the cases in which threshold voltage distributions A (PA) and B (PB) are negatively skewed.

FIG. 8A illustrates the case in which the estimated read levels of the asymmetrical threshold voltage distributions are determined through the average level method.

The processor 120 may determine average threshold voltages M_A and M_B of the respective threshold voltage distributions A (PA) and B (PB) using the average level method.

The processor 120 may determine the middle read level of the average threshold voltages M_A and M_B as an estimated read level R_ML. However, since the threshold voltage distributions do not have Gaussian distributions but are negatively skewed, an optimal read level R_OPT may be greater than the estimated read level R_ML. When the estimated read level R_ML is used to perform a read operation, a larger number of error bits may occur than when the optimal read level R_OPT is used to perform a read operation.

The case in which the estimated read levels of the asymmetrical threshold voltage distributions are determined through the min-bin method will be described with reference to FIG. 8B.

A dotted line 802 in FIG. 8B indicates the total number of memory cells in a section where memory cells having the threshold voltage distribution A (PA) and memory cells having the threshold voltage distribution B (PB) overlap each other.

As described with reference to FIG. 7, the processor 120 may determine, as the estimated read level, the middle level of the threshold voltage section including the smallest section cell number. However, since the threshold voltage distributions do not have Gaussian distributions but are negatively skewed, the optimal read level R_OPT may be greater than the estimated read level R_MIN. When the estimated read level R_MIN is used to perform a read operation, a larger number of error bits may occur than when the optimal read level R_OPT is used to perform a read operation.

In order to improve the reliability of data read from the semiconductor memory device 200, the processor 120 is required to determine a read level by reflecting actual threshold voltage distribution information. The read level determined by reflecting the actual threshold voltage distribution information may have a value dose to the optimal read level R_OPT.

The skewness of an actual threshold voltage distribution of memory cells may have a correlation with a memory cell characteristic which is determined according to a difference in process between the semiconductor memory devices 200. That is, the threshold voltage distributions of the semiconductor memory devices 200 fabricated through the same process may have similar skewness. The skewness may also have a correlation with a program/erase (P/E) cycle and a retention state of programmed data. The retention state of the programmed data may be determined by the extent of a charge loss depending on the time at which the data is programmed.

Figure 9A:
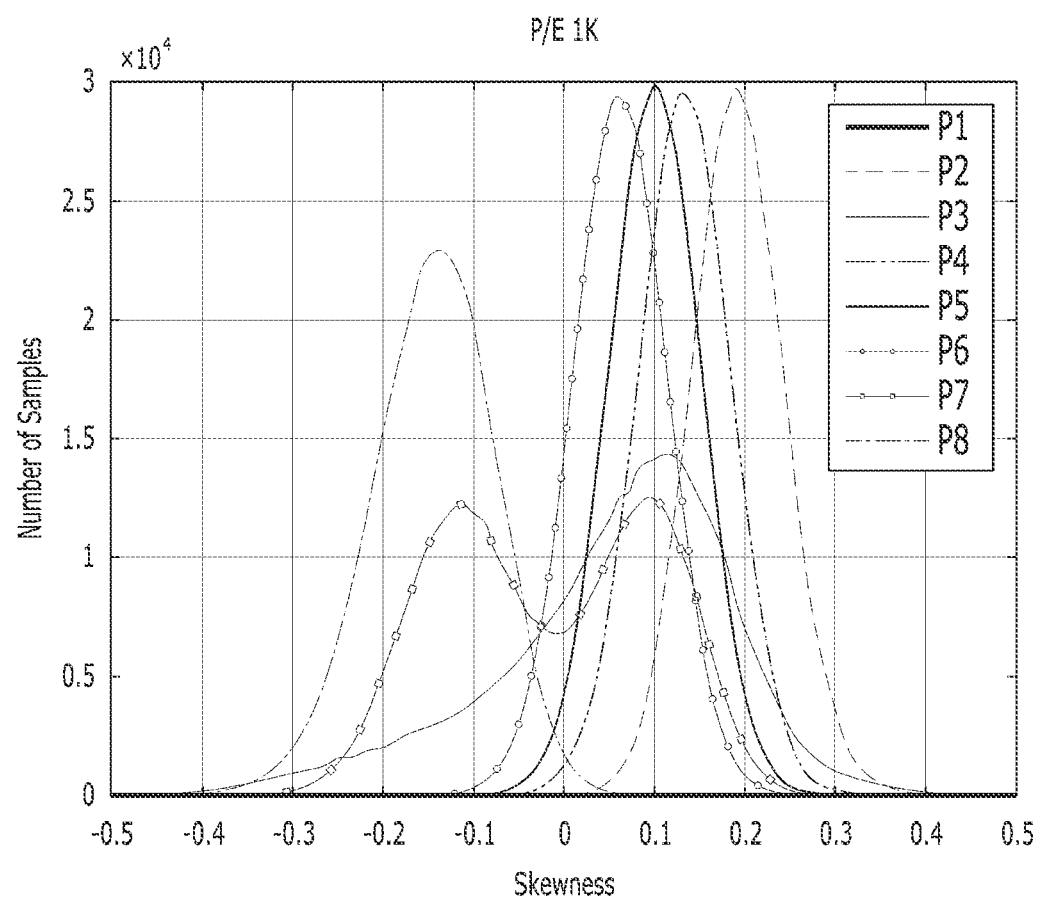

FIGS. 9A and 9B are graphs illustrating the skewnesses of threshold voltage distributions depending on memory cell characteristics and a P/E cycle.

In FIGS. 9A and 9B, the graphs illustrate the skewnesses which have been experimentally derived by using a plurality of semiconductor memory devices 200, fabricated through the same process, as samples. The horizontal axes of the graphs each indicate the skewness, and the vertical axes thereof each indicate the number of samples. The graphs illustrate the skewness distributions of memory cells which are programmed to have threshold voltage distributions P1 to P8, respectively. The skewness distributions for different threshold voltage distributions are illustrated as different types of lines. For example, 'P1' in the graphs represents the skewness distribution of memory cells which are programmed to have a first threshold voltage distribution P1.

The skewness may be derived by Equation 1 below.

$$Skew[X] = \qquad \text{[Equation 1]}$$
$$\frac{E[(x-\mu)^3]}{\sigma^3} = \frac{E[x^3] - 3\mu E[X^2] + 3\mu^2 E[X] - \mu^3}{\sigma^3} =$$
$$\frac{E[X^3] - 3\mu(\sigma^2 + \mu^2) + 3\mu^3 - \mu^3}{\sigma^3} = \frac{E[X^3] - 3\mu\sigma^2 - \mu^3}{\sigma^3}$$

Random variables X may be the threshold voltages of the memory cells which are programmed to have the respective threshold voltage distributions P1 to P8 in each of the samples. As the skewness increases in the negative direction, the corresponding threshold voltage distribution may be negatively skewed. On the other hand, as the skewness increases in the positive direction, the corresponding threshold voltage distribution may be positively skewed.

FIG. 9A illustrates the skewnesses of the threshold voltage distributions when the P/E cycle is 1,000 (i.e., 1K). The skewness of each threshold voltage distribution may generally form a Gaussian distribution. That is, among the plurality of semiconductor memory devices 200 fabricated through the same process, the number of samples in which the average value of threshold voltage distributions has skewness is the largest. Furthermore, as the skewness of each of the threshold voltage distributions is away from the average value, the number of samples having the corresponding skewness may decrease.

FIG. 9B illustrates the skewnesses of the threshold voltage distributions when the P/E cycle is 10,000 (i.e., 10K). As shown in the graph of FIG. 9A, the skewness of each threshold voltage distribution may generally form a Gaussian distribution. The skewness of each threshold voltage distribution when the P/E cycle is 1,000 may be different from that when the P/E cycle is 10,000. For example, when the P/E cycle is 1,000, a sixth threshold voltage distribution P6 may have a positive skewness of 0.05. However, when the P/E cycle is 10,000, the sixth threshold voltage distribution P6 may become almost symmetrical.

As long as the processor 120 can determine a read level set by reflecting the skewness information described with reference to FIGS. 9A and 9B, the read level set may have a value close to the optimal read level set. When the processor 120 can use a read level set having a value close to the optimal read level set during a read operation of the semiconductor memory device 200, the number of error bits in the data read from the semiconductor memory device 200 may be minimized.

In accordance with a first embodiment of the present invention, the processor 120 may generate an estimated read level set using the read level estimation method such as the average level method and the min-bin method, based on data read from memory cells by applying the reference read level set to the memory cells. The processor 120 may generate a compensated read level set by applying offset levels, determined based on the skewness information of the threshold voltage distributions, to the estimated read level set. The processor 120 may control a read operation of the semiconductor memory device 200 using the compensated read level set, thereby acquiring data whose error bits are minimized. The first embodiment will be described in detail with reference to FIGS. 10 to 15B.

Figure 10:
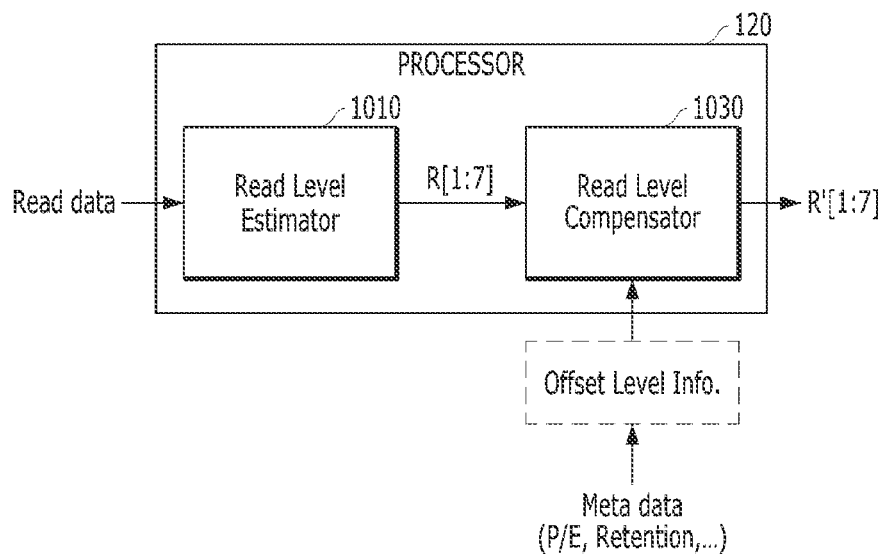
FIG. 10 is a diagram illustrating a processor in accordance with a first embodiment of the present invention.

FIG. 10 is a diagram illustrating a processor 120 in accordance with the first embodiment of the present invention. The processor 120 of FIG. 10 corresponds to the processor described with reference to FIG. 4A.

Referring to FIG. 10, the processor 120 may include a read level estimator 1010 and a read level compensator 1030. In accordance with an implementation, the read level estimator 1010 and the read level compensator 1030 may be implemented in software, and loaded to a memory 110 and driven in the processor 120. In accordance with another implementation, the read level estimator 1010 and the read level compensator 1030 may be implemented in hardware and included in the processor 120.

The read level estimator 1010 may receive data read by using a reference read level set, generate an estimated read level set R[1:7], and output the generated estimated read level set R[1:7]. The read level estimator 1010 may generate the estimated read level set R[1:7] using the read level estimation method based on Gaussian modeling, described with reference to FIGS. 6 and 7.

The read level compensator 1030 may receive the estimated read level set R[1:7] and offset level information, generate a compensated read level set R'[1:7], and output the generated compensated read level set R'[1:7].

The offset level information may include a lookup table indicating the relationships between offset levels and the values of meta data associated with the memory cells. The meta data which are associated with the skewnesses of threshold voltage distributions may include a P/E cycle and the retention states of programmed data. The offset level may be determined based on a difference between the optimal read level and the estimated read level. The lookup table may be determined in advance according to the skewnesses of the memory cell distributions, and stored in the memory 110.

Examples of the offset levels and the lookup table in accordance with the present embodiment will be described in detail with reference to FIGS. 11 and 12.

Figure 11:
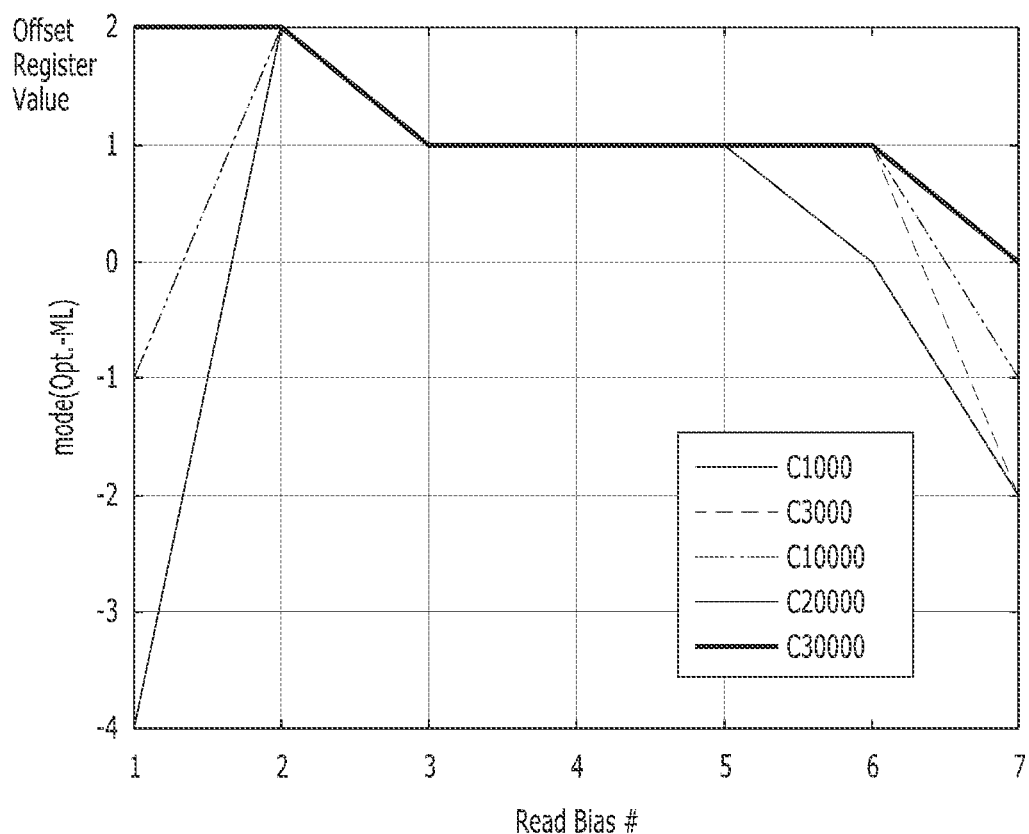
FIG. 11 is a graph illustrating an example of an offset level depending on read voltages and a P/E cycle.

FIG. 11 is a graph illustrating an example of an offset level depending on read voltages R1 to R7 and a P/E cycle.

The horizontal axis of the graph indicates the read voltages (or biases) R1 to R7. On the horizontal axis of the graph, the identifiers of the read voltages are marked. The vertical axis of the graph indicates the mode value mode (Opt.-ML) of an offset level (or an offset register value), obtained by subtracting a sample estimation read level from the sample optimal read level. The mode value of the offset level may be experimentally derived with the plurality of semiconductor memory devices 200 set to samples. The sample estimation read level may be a read level of a sample memory device estimated through the average level method based on Gaussian modeling, for example. The sample optimal read level is a read level of a sample memory device at which the smallest number of errors occur during a read operation, among read levels available in the semiconductor memory device 200. The sample optimal read level may be experimentally determined.

The sample optimal read level, the sample estimation read level and the offset level may be expressed as a register value corresponding to a read level. For example, when the processor 120 can adjust the read level of a first read voltage R1 using an 8-bit register, the read level may be determined as one of 256 register values. As the register value is increased, the read level may also be increased. For example, the register values may have linear relationships with the read level. However, the present disclosure is not limited to the case in which the register values and the read level necessarily have linear relationships therebetween.

Hereafter, the register values corresponding to the sample optimal read level, the sample estimated read level and the offset level, respectively, may be referred to as the sample optimal register value, a sample estimation register value and an offset register value. The offset register value may be determined as a value obtained by subtracting the sample estimation register value from the sample optimal register value.

The vertical axis of the graph indicates an offset register value corresponding to the mode value of the offset level. The offset register values of read voltages R1 to R7 according to different P/E cycles (e.g., C1000, C3000, C10000, C20000, C30000) are illustrated as different types of lines. The processor 120 may determine a compensated register value by applying an experimentally determined offset register value to the estimated register value. The compensated register value may be a register value corresponding to a compensated read level. For example, when the P/E cycle is 1,000, the offset register values of the first to seventh read voltages R1 to R7 may be '−4', '2', '1', '1', '1', '0' and '−2', respectively. The processor 120 may generate an estimated read level set based on the reference read level set. The reference read level set and the estimated read level set may include a plurality of reference register values and a plurality of estimated register values, respectively. The processor 120 may add the offset register values of '−4', '2', '1', '1' and '1' to the estimated register values corresponding to the first to fifth read voltages R1 to R5, and add to the estimated register values corresponding to the seventh read voltage R7, thereby generating the compensated read level set including a plurality of compensated register values.

Figure 12:
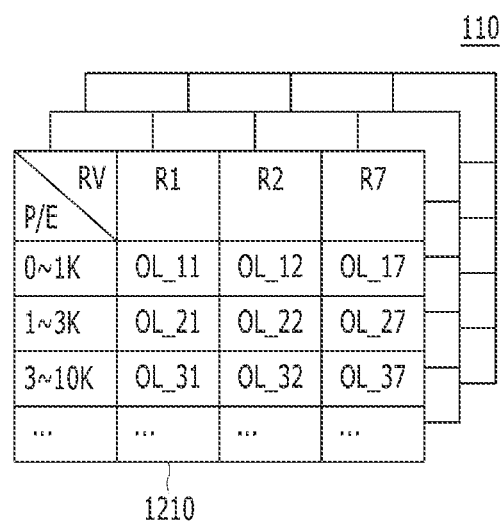
FIG. 12 illustrates a lookup table stored in a memory in accordance with the first embodiment of the present invention.

FIG. 12 illustrates a lookup table 1210 stored in the memory 110 in accordance with the first embodiment of the present invention.

Referring to FIG. 12, the lookup table 1210 may include offset levels OL_11 to OL_37 for read voltages according to a P/E cycle. In the example of FIG. 12, only the offset levels of some read voltages R1, R2 and R7 may he included in the lookup table 1210, and the offset levels of the other read voltages R3 to R6 may be omitted.

According to the memory cell characteristics of the semiconductor memory device 200, some threshold voltage distributions may have a shape dose to the Gaussian distribution regardless of the P/E cycle. When some threshold voltage distributions have a shape dose to the Gaussian distribution, it is possible to accurately divide the threshold voltage distributions even though the estimated read level is used as the compensated read level without applying offset levels to some read voltages.

Therefore, the offset levels, for example, the offset levels for read voltages whose offset register values are less than or equal to a predetermined magnitude regardless of the P/E cycle may be omitted from the lookup table 1210. in the example of FIG. 11, the offset register values of the third to sixth read voltages R3 to R6 may be determined as a value of '1' or less regardless of the P/E cycle. In the lookup table 1210 illustrated in FIG. 12, the offset levels of the third to sixth read voltages R3 to R6 may be omitted.

The processor 120 may omit an operation for applying an offset level to a read voltage whose offset level is omitted, by referring to the lookup table 1210, and use the estimated read level as the compensated read level. When an offset level is not stored as '0' in the lookup table 1210 but omitted from the lookup table 1210, a space for storing the lookup table 1210 in the memory 110 may be saved, and the operation for applying the offset level may be omitted.

By way of example, FIG. 12 illustrates the lookup table 1210 including the offset levels for read voltages according to the P/E cycle. However, the lookup table of the present embodiment is not limited thereto. For example, the memory 110 may further store a lookup table including an offset level for each read voltage depending on a retention state of programmed data. The processor 120 may selectively use a lookup table associated with the P/E cycle and a lookup table associated with the retention state.

Depending on a read level estimation method, an estimated read level and the optimal read level may be different from each other. The memory 110 may store lookup tables therein, the lookup tables including different offset levels for read level estimation methods. For example, the memory 110 may store lookup tables associated with the average level method and lookup tables associated with the min-bin label method.

Figure 13:
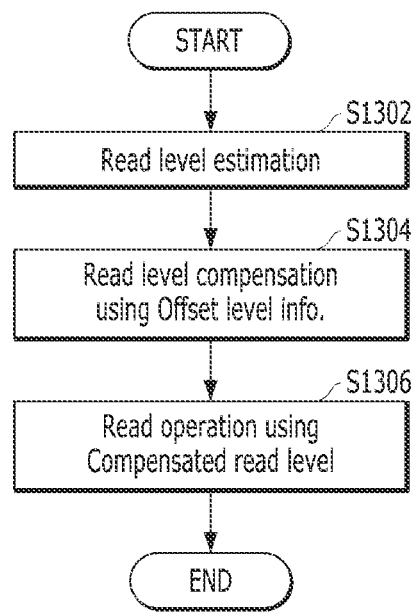

FIG. 13 is a flowchart illustrating an operation in accordance with the first embodiment of the present invention.

Referring to FIG. 13, in operation S1302, the processor 120 may estimate read levels based on reference read levels and data read by using the reference read levels. Examples of the method for generating estimated read levels by estimating read levels have been described with reference to FIGS. 6 and 7.

In operation S1304, the processor 120 may compensate the estimated read levels using offset level information. For example, the processor 120 may generate a compensated read level by applying an offset level, included in the offset level information, to the estimated read levels.

In operation S1306, the processor 120 may control the semiconductor memory device 200 to perform a read operation using the compensated read level.

The processor 120 may perform the read operation through the various methods described with reference to FIGS. 5 to 13, in order to read data from the semiconductor memory device 200. The processor 120 may perform the read operation using the various methods in a predetermined order, until the ECC decoder 133 successfully performs error correction decoding on the data read from the semiconductor memory device 200.

Hereafter, the case in which the processor 120 sequentially performs the history read operation, the RRT read operation, the read operation using the average level method, and the read operation using the min-bin method will be taken as an example for description.

FIG. 14 is a flowchart illustrating an operation in accordance with the first embodiment of the present invention.

Referring to FIG. 14, in operation S1402, the processor 120 may detect that both of the history read operation and the RRT read operation failed.

For example, the ECC decoder 133 may fail in error correction decoding on data read by using a history read level set and error correction decoding on data read by using read level sets included in the RRT. In order to acquire error-correctable data from the semiconductor memory device 200, the processor 120 may store data, read during the RRT read operation, in the memory 110, and perform operations S1404, S1406, S1408 and S1410.

In operation S1404, the processor 120 may generate a first estimated read level set using the average level method (or mean-level method).

For example, the processor 120 may determine, as a first reference read level set, the read level set used in the RRT read operation. The processor 120 may generate a first estimated read level set through the method described with reference to FIG. 6, using the first reference read level set and the data read during the RRT read operation.

In operation S1406, the processor 120 may generate a first compensated read level set using first offset level information.

For example, the processor 120 may use a first lookup table as the first offset level information, the first lookup table indicating the relationships between the P/E cycle and the offset levels among lookup tables which are stored in the memory 110 and associated with the average level method. The processor 120 may acquire P/E cycle information of memory cells to be read from the memory 110, and determine first offset levels of at least some voltages of the read voltages R1 to R7 by referring to the first lookup table. The processor 120 may generate a first compensated read level set by applying the first offset level to at least some of the first estimated read level sets by referring to the first lookup table.

In operation S1408, the processor 120 may control the semiconductor memory device 200 to perform a hard read operation using the first compensated read level set.

In operation S1410, the ECC decoder 133 may perform hard decision decoding on the data read from the semiconductor memory device 200 and determine whether the hard decision decoding passed.

When it is determined that the hard decision decoding passed ("YES" in operation S1410), the processor 120 may successfully end the read operation in operation S1412. In some cases, the processor 120 may output the error-corrected data to the outside or use the error-corrected data therein.

When it is determined that the hard decision decoding failed ("NO" in operation S1410), the processor 120 may control the semiconductor memory device 200 to perform an additional read operation using an additional read level set in operation S1414. The processor 120 may determine, as the additional read level set, read levels having a predetermined interval from the first compensated read level set. For example, the processor 120 may determine, as the additional read level set, a soft read level set associated with the first compensated read level set.

The processor 120 may store data, read through the additional read operation, in the memory 110, and perform operations S1418, S1420, S1422, S1424 and S1426.

The processor 120 may generate an estimated read level set using the min-bin method in operation S1418.

For example, the processor 120 may determine a soft read level set as a second reference read level set. The processor 120 may determine a second estimated read level set through the method described with reference to FIG. 7, using the second reference read level set and the data read through the soft read operation.

In operation S1420, the processor 120 may generate a second compensated read level set using second offset level information.

For example, the processor 120 may use a second lookup table as the second offset level information, the second lookup table indicating the relationships between the P/E cycle and the offset levels, among lookup tables which are stored in the memory 110 and associated with the min-bin method. The processor 120 may acquire P/E cycle information of memory cells to read from the memory 110, and generate the second compensated read level set by applying a second offset level to at least some of the second estimated read level sets with reference to the second lookup table.

In operation S1422, the processor 120 may control the semiconductor memory device 200 to perform a read operation using the second compensated read level set. In an implementation, the read operation may be a hard read operation or soft read operation.

In operation S1424, the ECC decoder 133 may perform error correction decoding (i.e., ECC decoding) on the data read from the semiconductor memory device 200 and determine whether the ECC decoding passed. In an implementation, the error correction decoding may be hard decision decoding or soft decision decoding.

When it is determined that the error correction decoding passed ("YES" in operation S1424), the processor 120 may successfully complete the read operation in operation S1412.

When it is determined that the error correction decoding did not pass ("NO" in operation S424), the processor 120 may determine the read operation as a fail and end the operation in operation S1426. In some cases, the processor 120 may provide a read fail signal to the outside.

Figure 15A:
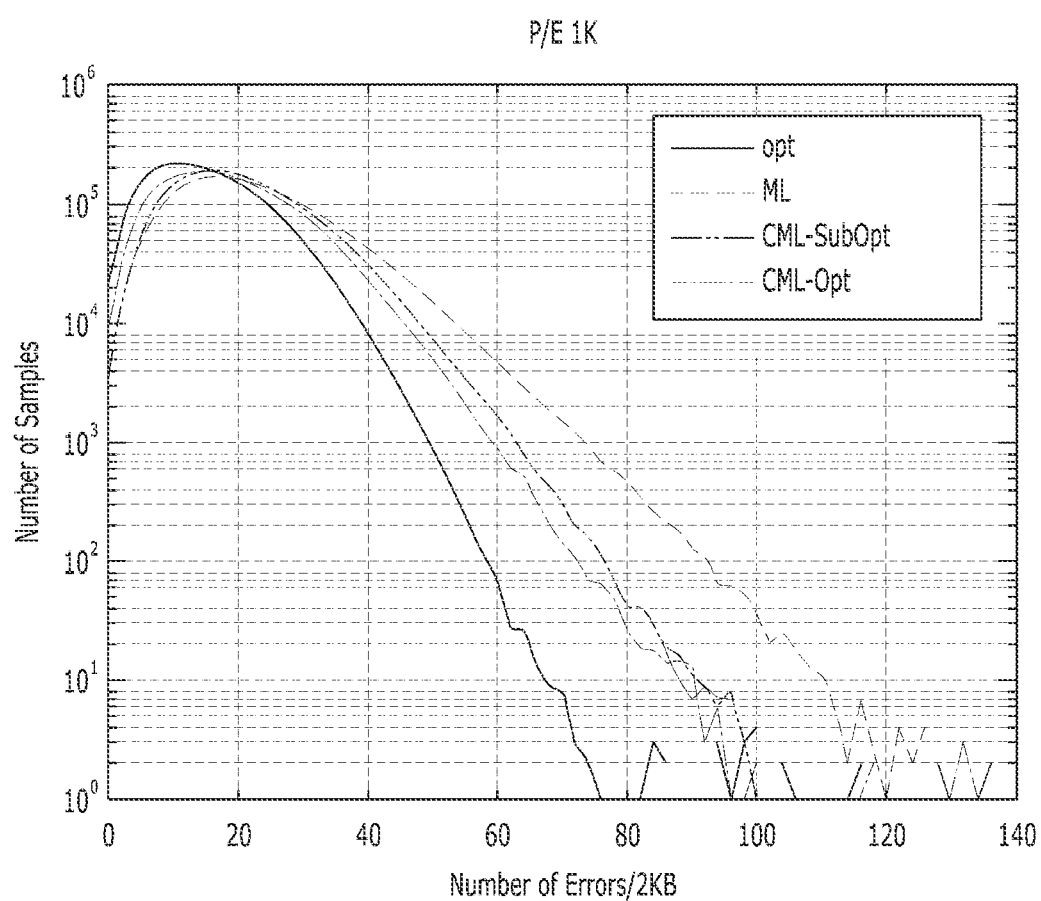
FIGS. 15A and 15B are graphs illustrating experiment results for an operation of a semiconductor memory device in accordance with the first embodiment of the present invention.
Figure 15B:
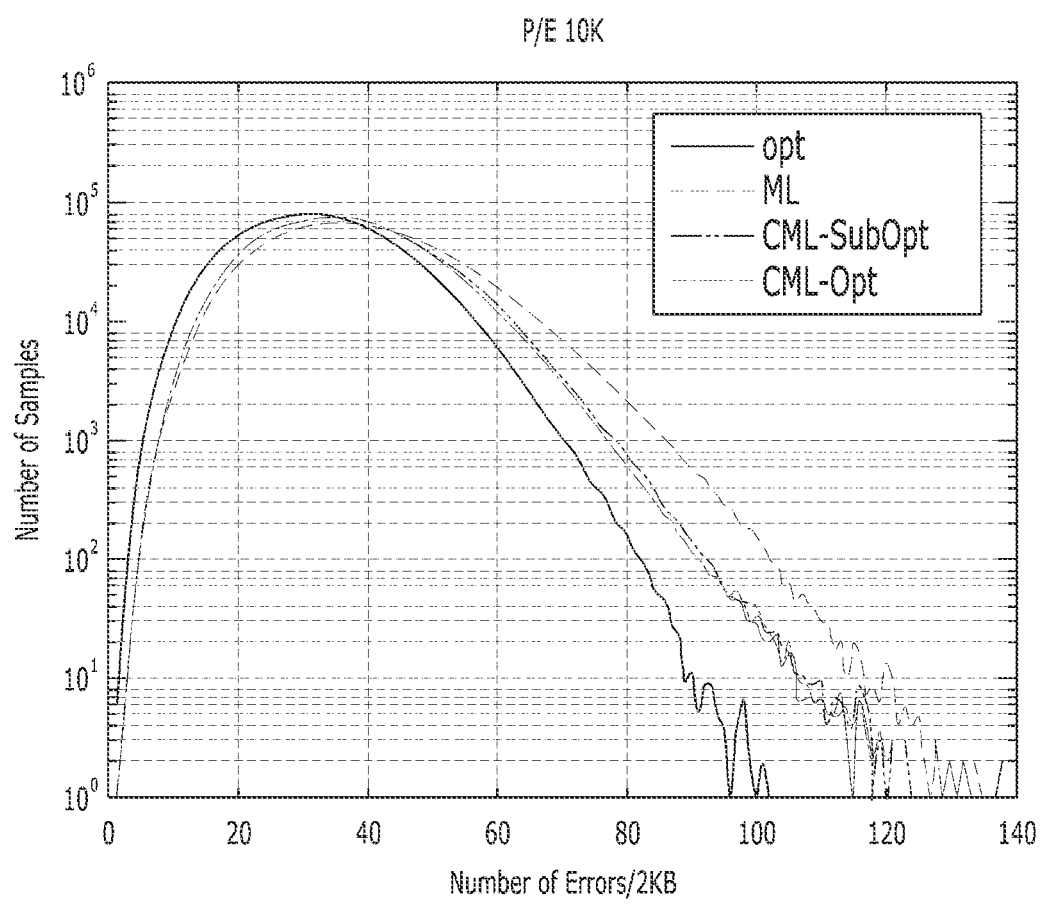

FIGS. 15A and 15B are graphs illustrating read operation experiment results of the semiconductor memory device 200, obtained by using the compensated read level set which is determined in accordance with the first embodiment of the present invention.

The graphs indicate the numbers of error bits when read operations are performed by using read level sets determined through various methods. The horizontal axes of the graphs each indicates the number of error bits per read data of 2 KB, whereas the vertical axes thereof each indicates the number of samples. That is, the graphs indicate distributions of the numbers of error bits in the samples of the semiconductor memory devices 200.

The graphs indicate the numbers of error bits in the case (Opt) that a read operation is performed through an optimal read level set, the case (ML) that a read operation is performed through an estimated read level set determined by the average level method, and the cases (compensated mean level (CML)-SubOpt and CML-Opt) that a read operation is performed by a compensated read level set determined in accordance with the first embodiment of the present invention.

When the semiconductor memory device 200 is actually used, the processor 120 may not accurately know the threshold voltage distributions of memory cells. Thus, the processor 120 may not accurately know the optimal read level set. Therefore, the case in which the read operation is performed through the optimal read level set corresponds to the ideal case, and serves only as a control group in the cases that read operations are performed through the compensated read level sets.

Among the cases that the read operations are performed is through the compensated read level sets, CML-Opt indicates an experiment result when the offset levels are applied to all the read voltages R1 to R7, CML-SubOpt indicates an experiment result when the offset levels are applied to some read voltages R2 to R5, and no offset levels are applied to the other read voltages R1, R6 and R7. Experiment results depending on different read level sets are marked as different types of lines.

FIG. 15A illustrates experiment results obtained by using, as samples, the semiconductor memory devices 200 whose P/E cycles are 1,000 (i.e., 1K). Referring to FIG. 15A, an error of 40 bits or more hardly occurs when the read operation is performed through the optimal read level set. On the other hand, when the read operation is performed through the estimated read level set, even an error of 60 bits or more may occur.

When the read operation is performed through the compensated read level set in accordance with the first embodiment of the present invention, an error of 50 bits or more hardly occurs. The smaller the number of cases in which a plurality of error bits occur, the lower the possibility that an error uncorrectable by means of the ECC decoder 133 will occur. Therefore, when the read operation is performed through the compensated read level set, the possibility that an uncorrectable error will occur may be reduced further than when the read operation is performed through the estimated read level set.

When the memory cell characteristics of the semiconductor memory device 200 are changed, the skewnesses of the threshold voltage distributions may be changed. The processor 120 may use a lookup table in which offset levels are different from each other, depending on the memory cell characteristics of the semiconductor memory device 200. Although the processor 120 controls the semiconductor memory device 200 having a certain memory cell characteristic, the processor 120 may generate an estimated read level set through the same method, and generate a compensated read level set using lookup tables which are determined in advance according to the corresponding memory cell characteristic.

FIG. 15B illustrates experiment results obtained by using, as samples, the semiconductor memory devices 200 each having a P/E cycle of 10,000 (i.e., 10K). When the read operation is performed through the compensated read level set in the case that the P/E cycle is 10,000, the possibility that an uncorrectable error will occur may be reduced further than when the read operation is performed through the estimated read level set, as in the case that the P/E cycle is 1,000.

When the possibility that an uncorrectable error will occur is reduced, the possibility that the read operation will be successfully completed may be increased. Thus, the reliability of the semiconductor memory device 200 may be improved. When error correction decoding is successfully performed on read data, the read operation may be ended without applying an additional read voltage for reading the data. Thus, the performance of the read operation may also be improved.

In accordance with a second embodiment of the present invention, the processor 120 may generate a parameter value for using the read level estimation method, based on data read from memory cells by applying read voltages having a reference read level set. The processor 120 may generate a compensated parameter value by applying a parameter offset to the parameter value, the parameter offset being determined based on skewness information of a threshold voltage distribution. The processor 120 may generate compensated read levels by performing read level estimation according to the read level estimation method, using the compensated parameter value. In an implementation, the processor 120 may generate the compensated parameter value by applying a parameter multiplier, which is determined based on the skewness information of the threshold voltage distribution, to the parameter value, or generate the compensated parameter value by applying both of the parameter multiplier and the parameter offset. The processor 120 may control the read operation of the semiconductor memory device 200 using the compensated read level, thereby acquiring data whose error bits are minimized. The second embodiment will be described in detail with reference to FIGS. 16 and 17.

Figure 16:
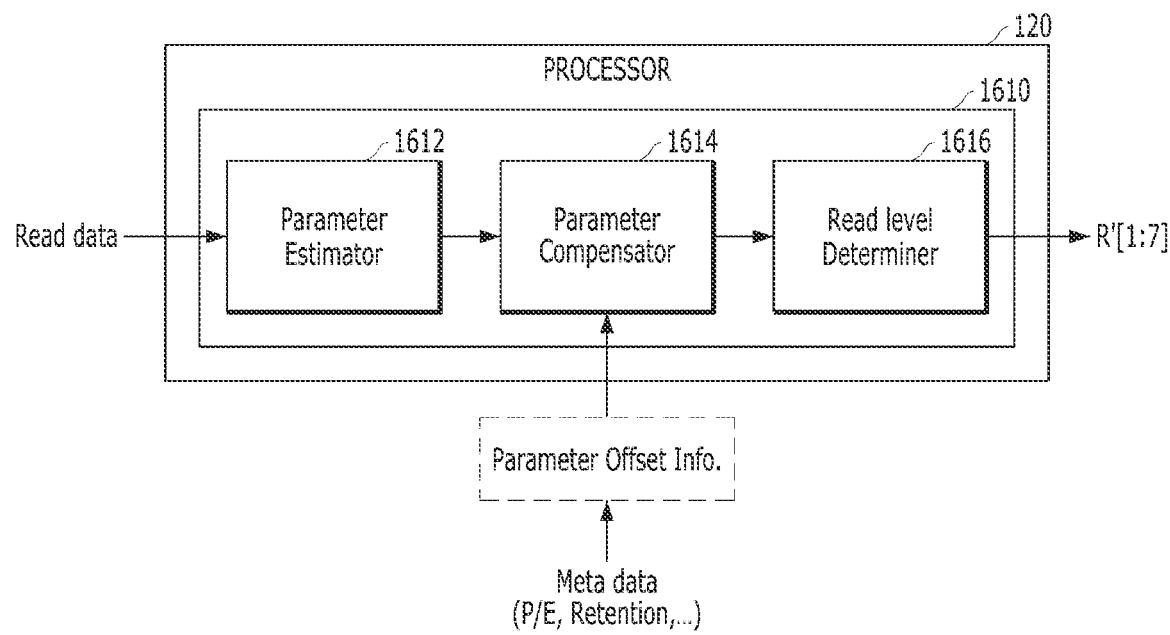
FIG. 16 is a diagram illustrating a processor in accordance with a second embodiment of the present invention.

FIG. 16 is a diagram illustrating a processor 120 in accordance with the second embodiment of the present invention. The processor 120 of FIG. 16 corresponds to the processor described with reference to FIG. 4A.

Referring to FIG. 16, the processor 120 may include a read level estimator 1610.

The read level estimator 1610 may estimate a read level set using a read level estimation method such as the average level method or the min-bin label method which has been described with reference to FIGS. 6 and 7. The read level estimator 1610 may include a parameter estimator 1612, a parameter compensator 1614 and a read level determiner 1616.

The parameter estimator 1612 may receive data read by using a reference read level set, and generate an estimated parameter value for determining an estimated read level using the read level estimation method.

For example, when an ECC decoder 133 failed in error correction decoding on data read by a history read operation or an RRT read operation, the parameter estimator 1612 may determine, as the reference read level set, the read level set which has been used to perform the read operation. When the read level estimator 1610 determines a read level using the average level method, the parameter estimator 1612 may receive the data on which the ECC decoder 133 failed in error correction decoding, and determine, as the estimated parameter value, the average threshold voltage of the threshold voltage distributions and the standard deviation of the threshold voltage distributions.

The parameter compensator 1614 may receive the estimated parameter value and parameter offset information, and generate a compensated parameter value.

The parameter offset information may include a lookup table indicating the relationships between the parameter offset and the values of meta data. The meta data may include a P/E cycle, a retention state of programmed data and the like. The parameter offset may be determined based on a difference between a sample estimation parameter value and a sample optimal parameter value. The sample optimal parameter value may be experimentally determined with the semiconductor memory devices 200 set to samples. For example, when the parameter value includes the average threshold voltage level and the standard deviation, the sample optimal parameter value may be determined as the average threshold voltage level and the standard deviation depending on the values of the meta data, which are experimentally derived according to the memory cell characteristics of the semiconductor memory devices 200. The lookup table may be determined in advance according to the skewnesses of the memory cell distributions, and stored in a memory 110. An example of the lookup table in accordance with the present embodiment will be described in detail with reference to FIG. 17.

The read level determiner 1616 may perform read level estimation using a compensation parameter value which is determined based on the estimated parameter value and the parameter offset information, thereby generating compensated read levels into which the skewnesses of the memory cells are reflected.

Figure 17:
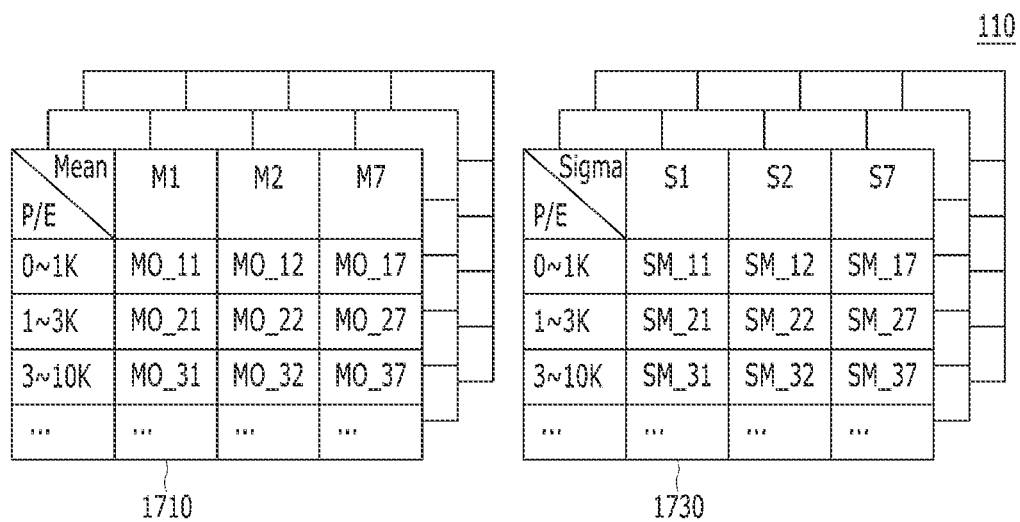
FIG. 17 illustrates first and second lookup tables stored in a memory in accordance with the second embodiment of the present invention.

FIG. 17 illustrates first and second lookup tables 1710 and 1730 stored in the memory 100 in accordance with the second embodiment of the present invention.

Referring to FIG. 17, the first lookup table 1710 may include offsets MO_11 to MO_37 of an average threshold voltage according to a P/E cycle.

When estimated threshold voltages of threshold voltage distributions are determined through a threshold voltage estimation method based on Gaussian modeling in the case that the threshold voltage distributions are asymmetrical, the determined voltages may be different from actual average threshold voltages according to the memory cell characteristics of the semiconductor memory device 200.

In accordance with the second embodiment of the present invention, an offset of the average threshold voltage may be determined in advance according to the P/E cycle and the memory cell characteristic of the semiconductor memory device 200. The offset of the average threshold voltage may compensate for a difference between the actual average threshold voltage and the estimated average threshold voltage which are experimentally determined according to the memory cell characteristic.

The second lookup table 1730 may include multipliers SM_11 to SM_37 of a standard deviation according to the P/E cycle.

The standard deviation of actual threshold voltage distributions may be different from a standard deviation which is determined as a constant in advance.

In accordance with the second embodiment of the present invention, the multipliers of the standard deviation may compensate for a difference between the standard deviation which is determined in advance, and the actual standard deviation which is experimentally determined according to the memory cell characteristic.

The first and second lookup tables 1710 and 1730 may not include offsets of the average threshold voltages of some threshold voltage distributions and multipliers of the standard deviation thereof, like the lookup table 1210 described with reference to FIG. 12. For example, when there is a threshold voltage distribution whose average threshold voltage has an offset close to '0' regardless of the P/E cycle, the offset for the corresponding threshold voltage distribution may be omitted from the first lookup table 1710. Furthermore, when there is a threshold voltage distribution having a standard deviation close to the standard deviation determined in advance regardless of the P/E cycle, a multiplier for the corresponding threshold voltage distribution may be omitted from the second lookup table 1730.

By way of example, FIG. 17 illustrates the first lookup table 1710 indicating the offsets of the average threshold voltages according to the P/E cycle and the second lookup table 1730 indicating the multipliers of the standard deviations. However, the lookup tables of the present embodiment are not limited thereto. For example, the memory 110 may further store lookup tables indicating offsets of average threshold voltages and multipliers of standard deviations depending on retention states of programmed data. The processor 120 may selectively use lookup tables associated with the P/E cycle and lookup tables associated with the retention states.

Depending on the read level estimation method, the offset values or multiplier values of the parameters may be different, or the types of the parameters may be different. For example, even when the min-bin method is used, the average threshold voltages and standard deviations of threshold voltage distributions may be used to generate an estimated read level, like when the Gaussian modeling method is used. However, a parameter offset or parameter multiplier for generating a compensated read level may be differently determined between when the Gaussian modeling method is used and when the min-bin method is used. The memory 110 may store different lookup tables therein, the lookup tables including offsets of parameters for a plurality of read level estimation methods.

In accordance with the second embodiment of the present invention, the processor 120 may reflect, into the compensated parameter value, skewness information of the threshold voltage distributions depending on the memory cell characteristic of the semiconductor memory device 200. The processor 120 may determine a compensated read level set dose to the optimal read level set based on the compensated parameter value. Therefore, when a read operation is performed through the compensated read level set, the possibility that an uncorrectable error will occur may be reduced further than when the read operation is performed through the estimated read level set. When the possibility that an uncorrectable error will occur is reduced, the reliability of the semiconductor memory device 200 may be improved, and the performance of a read operation may also be improved.

Although various embodiments have been described for illustrative purposes, it will be apparent to those skilled in the art that various changes and modifications may be made without departing from the spirit and scope of the invention as defined in the following claims.

What is claimed is:

1. A controller for controlling a memory device including memory cells, the controller comprising:
   a memory suitable for storing offset level information which is determined based on a sample read level according to characteristics of the memory cells and Gaussian modeling of the memory cells; and
   a processor suitable for generating an estimated read level based on the Gaussian modeling and data read from the memory cells, and applying a compensated read voltage to control the memory device to perform read operations of the memory cells,
   wherein the compensated read voltage is generated by applying the offset level information to the estimated read level.

2. The controller of claim 1, wherein the sample read level is a read level at which a number of error bits in read data is minimized in a sample memory device having the same characteristics of memory cells, among a plurality of read levels which the memory device is able to apply to the memory cells.

3. The controller of claim 1, wherein the processor generates the estimated read level through an average level method, which includes calculating the section cell numbers corresponding to threshold voltage sections, based on the read data, determining average threshold voltage levels of respective threshold voltage distributions based on the section cell numbers and a set standard deviation, and determining a median value between adjacent average threshold voltage levels as the estimated read level.

4. The controller of claim 3, wherein the processor updates the estimated read level through a min-bin method, which includes determining a function of the number of memory cells depending on a threshold voltage level in the threshold voltage section having the smallest section cell number among the new section cell numbers corresponding to threshold voltage sections divided by additional read levels having set intervals from the read level of the compensated read voltage, based on the average threshold voltage level and the standard deviation, and determining, as a new estimated read level, a threshold voltage level corresponding to the minimum value of the determined function.

5. The controller of claim 4, wherein the offset level information comprises an offset level associated with the average level method and an offset level associated with the min-bin method.

6. The controller of claim 1, wherein the processor generates the estimated read level by determining a function of the number of memory cells depending on a threshold voltage level in the threshold voltage section having the smallest number of section cells among the section cell numbers corresponding to threshold voltage sections divided by additional read levels having set intervals from a hard read voltage, based on the average threshold voltage level and a set standard deviation, and determining, as the estimated read level, a threshold voltage level corresponding to the minimum value of the determined function.

7. The controller of claim 1, wherein the offset level information comprises a lookup table indicating the relationship between the values of meta data associated with the memory cells and an offset level corresponding to the read voltage.

8. The controller of claim 7, wherein the meta data comprise program/erase (P/E) cycles of the memory cells or retention states of data programmed in the memory cells.

9. The controller of claim 7, wherein the offset level information comprises offset levels for one or more read voltages among a plurality of read voltages for reading the memory cells, wherein one or more offset levels for each of the read voltages exceed a set magnitude.

10. The controller of claim 1, wherein the processor obtains the data read from the memory cells by controlling the memory device to perform a read operation on the memory cells by using a history read level or a read level included in a read retry table (RRT), and generates the estimated read level when a fail in error correction decoding on the read data is detected.

11. The controller of claim 1, further comprising an error correction code (ECC) decoder suitable for performing error correction decoding on data read from the memory cells using the compensated read level.

12. A controller for controlling a memory device including memory cells, the controller comprising:
a memory suitable for storing parameter offset information which is determined based on a sample parameter value according to characteristics of the memory cells and Gaussian modeling of the memory cells; and
a processor suitable for generating an estimated parameter value based on data read from the memory cells and the Gaussian modeling, generating a compensated parameter value by applying parameter offset information to the estimated parameter value, and controlling the memory device to perform a read operation using a compensated read level which is generated by estimating a read level based on the compensated parameter value.

13. The controller of claim 12, wherein the parameter offset information is determined in advance based on the sample parameter value and a sample estimation parameter value which are experimentally determined according to memory cell characteristics of the memory device.

14. The controller of claim 12, wherein the processor generates the compensated read level by using an average level method, which includes calculating the section cell numbers corresponding to threshold voltage sections, based on the read data, generating the estimated parameter value by determining estimated average threshold voltage levels of the respective threshold voltage distributions based on the section cell numbers and a standard deviation, generating a compensated average threshold voltage level by applying the parameter offset information to the estimated average threshold voltage levels, and determining, as the compensated read level, a median value between adjacent compensated average threshold voltage levels.

15. The controller of claim 14, wherein the memory further stores multiplier information of a parameter which is determined based on the sample parameter value and the Gaussian modeling of the memory cells, and
wherein the processor further performs an operation of generating a compensated standard deviation by applying the multiplier information of the parameter to a set standard deviation, to determine the estimated average threshold voltage levels.

16. The controller of claim 15, wherein the processor updates the compensated read level through a min-bin method, which includes determining a function of the number of memory cells depending on a threshold voltage level in the threshold voltage section having the smallest number of section cells among the numbers of new section cells corresponding to threshold voltage sections divided by additional read levels having set intervals from the compensated read level, based on the compensated average threshold voltage level and the compensated standard deviation, and determining, as a new compensated read level, a threshold voltage level corresponding to the minimum value of the determined function.

17. The controller of claim 16, wherein the offset level information comprises an offset level associated with the average level method and an offset level associated with the min-bin method.

18. The controller of claim 12, wherein the parameter level information comprises a lookup table indicating the relationship between the values of meta data associated with the memory cells and parameter offsets corresponding to the read voltage.

19. The controller of claim 18, wherein the meta data comprises program/erase (P/E) cycles of the memory cells or retention states of data programmed in the memory cells.

20. A memory system comprising:
a memory device including a plurality of memory cells; and
a controller coupled to the memory device and including a processor configured to:
generate an estimated read level based on data, which is read from the memory cells, using Gaussian modeling;
generate a compensated read level based on the estimated read level and an offset level, which is determined based on a difference between an optimal read level according to characteristics of the memory cells and a read level according to the Gaussian modeling; and
control the memory device to perform a read operation on the memory cells using the compensated read level.

* * * * *